(12) United States Patent
Karda et al.

(10) Patent No.: US 11,296,094 B2
(45) Date of Patent: Apr. 5, 2022

(54) MEMORY DEVICE HAVING SHARED ACCESS LINE FOR 2-TRANSISTOR VERTICAL MEMORY CELL

(71) Applicant: Micron Technology, Inc., Boise, ID (US)

(72) Inventors: Kamal M. Karda, Boise, ID (US); Karthik Sarpatwari, Boise, ID (US); Durai Vishak Nirmal Ramaswamy, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 16/725,439

(22) Filed: Dec. 23, 2019

(65) Prior Publication Data

US 2020/0212051 A1 Jul. 2, 2020

Related U.S. Application Data

(60) Provisional application No. 62/785,150, filed on Dec. 26, 2018.

(51) Int. Cl.
*H01L 27/108* (2006.01)
(52) U.S. Cl.
CPC .. *H01L 27/10897* (2013.01); *H01L 27/10844* (2013.01)
(58) Field of Classification Search
CPC ......... H01L 27/10897; H01L 27/10844; H01L 27/10802
See application file for complete search history.

(56) References Cited

U.S. PATENT DOCUMENTS

| 6,396,745 B1 | 5/2002 | Hong et al. |
| 2013/0193400 A1 | 8/2013 | Sandhu et al. |

(Continued)

FOREIGN PATENT DOCUMENTS

| CN | 113383417 | 9/2021 |
| KR | 20130109821 | 10/2013 |
| WO | 2020139837 | 7/2020 |

OTHER PUBLICATIONS

"International Application Serial No. PCT US2019 068356, International Search Report dated Apr. 29, 2020", 4 pgs.

(Continued)

*Primary Examiner* — Edward Chin
(74) *Attorney, Agent, or Firm* — Schwegman Lundberg & Woessner, P.A.

(57) ABSTRACT

Some embodiments include apparatuses and methods of forming the apparatuses. One of the apparatuses includes a memory cell and first, second, and third data lines located over a substrate. The memory cell includes a first transistor and a second transistor. The first transistor includes a charge storage structure located on a first level of the apparatus, and a first channel region electrically separated from the charge storage structure. The second transistor includes a second channel region located on a second level of the apparatus and electrically coupled to the charge storage structure. The first and second data lines are located on a third level of the apparatus and electrically coupled to the first channel region. The first level is between the substrate and the third level. The third data line is electrically coupled to the second channel region and electrically separated from the first channel region.

15 Claims, 23 Drawing Sheets

(56) References Cited

U.S. PATENT DOCUMENTS

2013/0256774 A1* 10/2013 Jeon .................. G11C 11/4097
257/314
2017/0271338 A1  9/2017 Yamazaki et al.
2018/0061834 A1  3/2018 Derner et al.

OTHER PUBLICATIONS

"International Application Serial No. PCT US2019 068356, Written Opinion dated Apr. 29, 2020", 4 pgs.
"International Application Serial No. PCT US2019 068356, International Preliminary Report on Patentability dated Jul. 8, 2021", 6 pgs.

* cited by examiner

US 11,296,094 B2

MEMORY DEVICE HAVING SHARED ACCESS LINE FOR 2-TRANSISTOR VERTICAL MEMORY CELL

PRIORITY APPLICATION

This application claims the benefit of priority to U.S. Provisional Application Ser. No. 62/785,150, filed Dec. 26, 2018, which is incorporated herein by reference in its entirety.

BACKGROUND

Memory devices are widely used in computers and many other electronic items to store information. Memory devices are generally categorized into two types: volatile memory device and non-volatile memory device. An example of a volatile memory device includes a dynamic random-access memory (DRAM) device. An example of a non-volatile memory device includes a flash memory device (e.g., a flash memory stick). A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The described memory device can include a signal access line to control two transistors of a memory cell. This can lead to reduced power dissipation and improved processing. Other improvements and benefits of the described memory device and its variations are discussed below with reference to FIG. 1 through FIG. 20.

Figure 1:
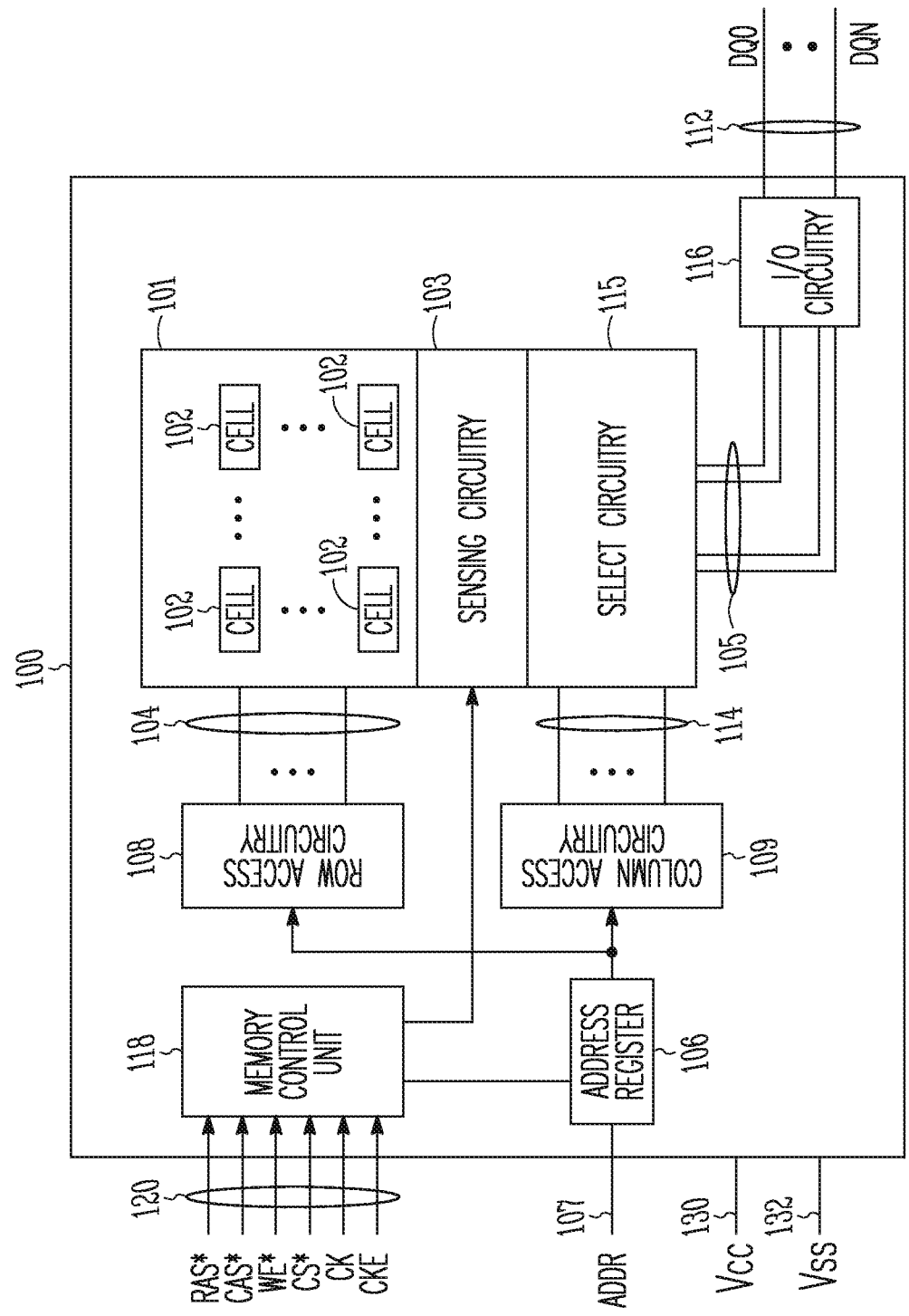
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 is a volatile memory device (e.g., a DRAM device), such that memory cells 102 are volatile memory cells. Thus, information stored in memory cells 102 may be lost (e.g., invalid) if supply power (e.g., supply voltage Vcc) is disconnected from memory device 100. Hereinafter, Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on Vcc, such an internal voltage may be used instead of Vcc.

In a physical structure of memory device 100, each of memory cells 102 can include transistors (e.g., two transistors) formed vertically (e.g., stacked one over the other in different layers) in different levels over a substrate (e.g., a semiconductor substrate) of memory device 100. The structure of memory array 101, including memory cells 102, can include the structure of memory arrays and memory cells described below with reference to FIG. 2 through FIG. 20.

As shown in FIG. 1, memory device 100 can include access lines (e.g., word lines) 104 and data lines (e.g., bit lines) 105. Memory device 100 can use signals (e.g., word line signals) on access lines 104 to access memory cells 102 and on data lines 105 to provide information (e.g., data) to be stored in (e.g., written to) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., an X-decoder) 108 and column access circuitry (e.g., a Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1")), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of the information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. 20.

Figure 2:
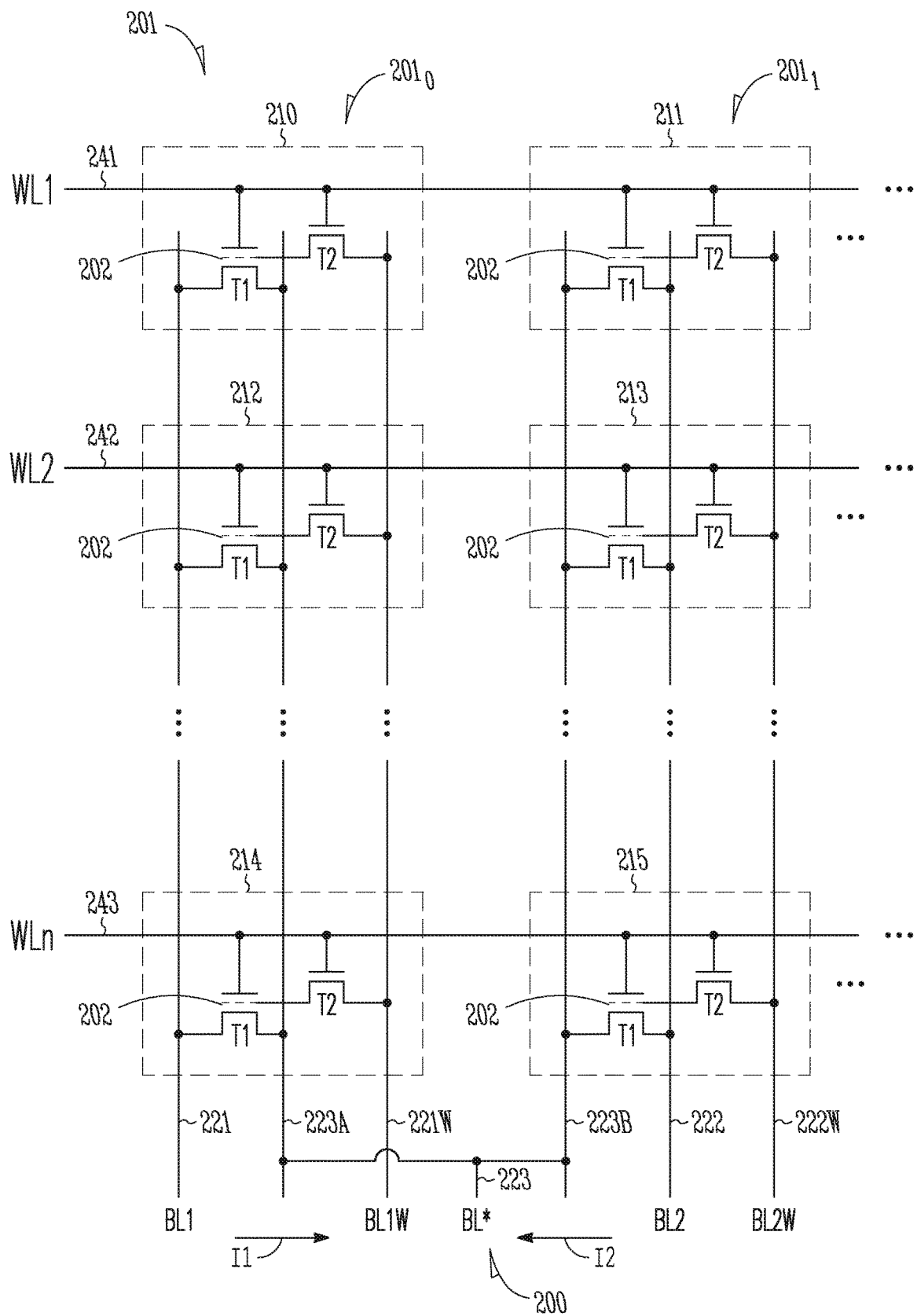
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). Transistor T1 can include a charge storage-based structure (e.g., a floating gate-based structure). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can include the floating gate of transistor T1. Thus, memory device 200 can be called a floating gate-based DRAM device.

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. Each of access lines 241, 242, and 243 can be structured as at least one conductive line (e.g., one conductive or multiple conductive lines that can be electrically coupled (e.g., shorted) to each other). Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Two separate access lines can be used to control respective transistors T1 and T2 during an access to a respective memory cell during read and write operations. However, using a shared access line (e.g., single access line) in memory device 200 to control both transistors T1 and T2 of a respective memory cell can save space and simplify operation of memory device 200.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241.

The gate of each of transistors T1 and T2 of memory cell 212 can be part of access line 242. The gate of each of transistors T1 and T2 of memory cell 213 can be part of access line 242.

The gate of each of transistors T1 and T2 of memory cell 214 can be part of access line 243. The gate of each of transistors T1 and T2 of memory cell 215 can be part of access line 243.

Memory device 200 can include data lines (e.g., read bit lines) 221, 222, and 223 that can carry respective signals (e.g., read bit line signals) BL1, BL2, and BL*, and data lines (e.g., write bit lines) 221W and 222W that can carry respective signals (e.g., write bit line signals) BL1W and BL2W. Each of data lines 221, 222, 223, 221W, and 222W can be structured as a conductive line.

Data line 223 can be a common data line (e.g., shared data line) for memory cell group $201_0$ or memory cell group $201_1$. For example, as shown in FIG. 2, data line 223 can include a combination of data lines 223A and 223B of memory cell group $201_0$ or memory cell group $201_1$, respectively, in which data lines 223A and 223B can be electrically coupled (e.g., shorted) together. In an alternative example of memory device 200, data lines 223A and 223B may not be electrically coupled (e.g., are not shorted) to each other. In such an alternative example of memory device 200, the value (e.g., voltage value) of signals (e.g., bit line signals) on the separate data lines 223A and 223B during a read or write operation of memory device 200 can be the same as the voltage value of signal BL* of FIG. 2.

In FIG. 2, during a read operation, memory device 200 can use data line 223 to obtain information read (e.g., sensed) from a selected memory cell of memory cell group $201_0$ or memory cell group $201_1$. During a write operation, memory device 200 can use data line 221W to provide information to be stored in a selected memory cell of memory cell group $201_0$, and data line 222W to provide information to be stored in a selected memory cell of memory cell group $201_1$.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., 210, 212, or 214) can include a current path (e.g., read current path) through a channel region of transistor T1 of that particular memory cell and data lines 221 and 223. In memory cell group $201_1$, a read path of a particular memory cell (e.g., 211, 213, or 215) can include a current path (e.g., read current path) through a channel region of transistor T1 of that particular memory cell and data lines 222 and 223. Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include a current path (e.g., write current path) through a channel region of transistor T2 of that particular memory cell and data line 221W. In memory cell group $201_1$, a write path of a particular memory cell (e.g., 211, 213, or 215) can include a current path (e.g., a write current path) through a channel region of transistor T2 of that particular memory cell and data line 222W. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (e.g., unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path without affecting (e.g., without turning on) transistor T2 on the write path (e.g., path through transistor T2). This can prevent leaking of charge from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows, Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt for state "0"<Vt for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 for state "0"<Vt1 for state "1", where Vt1 for state "0"=0V (or alternatively Vt1 for state "0">0V), and Vt1<Vt2.

During a read operation of memory device 200, only one memory cell of the same memory cell group can be selected at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be selected one at a time. For example, memory cells 210 and 211 can be selected one at a time, memory cells 212 and 213 can be selected one at a time, and memory cells 214 and 215 can be selected one at a time. Alternatively, pairs of memory cells coupled to the same access line can be selected to read information from one memory cell of each of the selected pairs of memory cells. For example, the pair of memory cells 210 and 211 (which is coupled to access line 241), and one or more other pairs of memory cells (not shown) coupled to access line 241, can be selected (e.g., concurrently selected) during a read operation. FIG. 2 shows one pair of memory cells coupled to each respective access line 241, 242, or 243 as an example. However, memory device 200 may include additional pairs of memory cells that are not shown in FIG. 2. Each pair of the additional pairs of memory cells can have a respective common data line (e.g., similar to data line 223).

In FIG. 2, the value of information read from the selected memory cell of memory cell group $201_0$ during a read operation can be determined based on the value of a current detected (e.g., sensed) from a read path (described above) that includes transistor T1 of the selected memory cell (e.g., memory cell 210, 212, or 214) and data lines 221 and 223. The value of information read from the selected memory cell of memory cell group $201_1$ during a read operation can be determined based on the value of a current detected (e.g., sensed) from a read path that includes transistor T1 of the selected memory cell (e.g., memory cell 211, 213, or 215) and data lines 222 and 223.

Memory device 200 can include detection circuitry (not shown) that can operate during a read operation to detect (e.g., sense) a current I1 on a read path that includes data lines 221 and 223 if a memory cell in memory cell group $201_0$ is selected, and to detect a current I2 on a read path that includes data lines 222 and 223 if a memory cell in memory cell group $201_1$ is selected. The value of the detected current can be based on the value of information stored in the selected memory cell. For example, depending on the value of information stored in the selected memory cell of memory cell group $201_0$, the value of the detected current (e.g., the value of current I1) between data lines 221 and 223 can be zero or greater than zero. Similarly, depending on the value of information stored in the selected memory cell of memory cell group $201_1$, the value of the detected current (e.g., the value of current I2) between data lines 222 and 223 can be zero or greater than zero. Memory device 200 can include circuitry (not shown) to translate the value of detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cells 210, 212, and 214 in this example). In another example, memory cells 211, 213, and 215 of memory cell group $201_1$ can be selected one at a time during a write operation to store information in the selected memory cell (e.g., one of memory cells 211, 213, and 215 in this example).

During a write operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path that includes data line 221W and transistor T2 of the selected memory cell (e.g., memory cell 210, 212, or 214). Information to be stored in a selected memory cell of memory cell group $201_1$ during a write operation can be provided through a write path that includes data line 222W and transistor T2 of the selected memory cell (e.g., memory cell 211, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (e.g., to reflect the value of information stored in the selected memory cell) by applying a voltage on a write path that includes transistor T2 of that particular memory cell and the data line (e.g., data line 221W or 222W) coupled to that particular memory cell. For example, a voltage having one value (e.g., 0V) can be applied on data line 221W (e.g., 0V can be provided to signal BL1W) if information to be stored in a selected memory cell among memory cells 210, 212, and 214 has one value (e.g., "0"). In another example, a voltage having another value (e.g., a positive voltage) can be applied on data line 221W (e.g., a positive voltage can be provided to signal BL1W) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
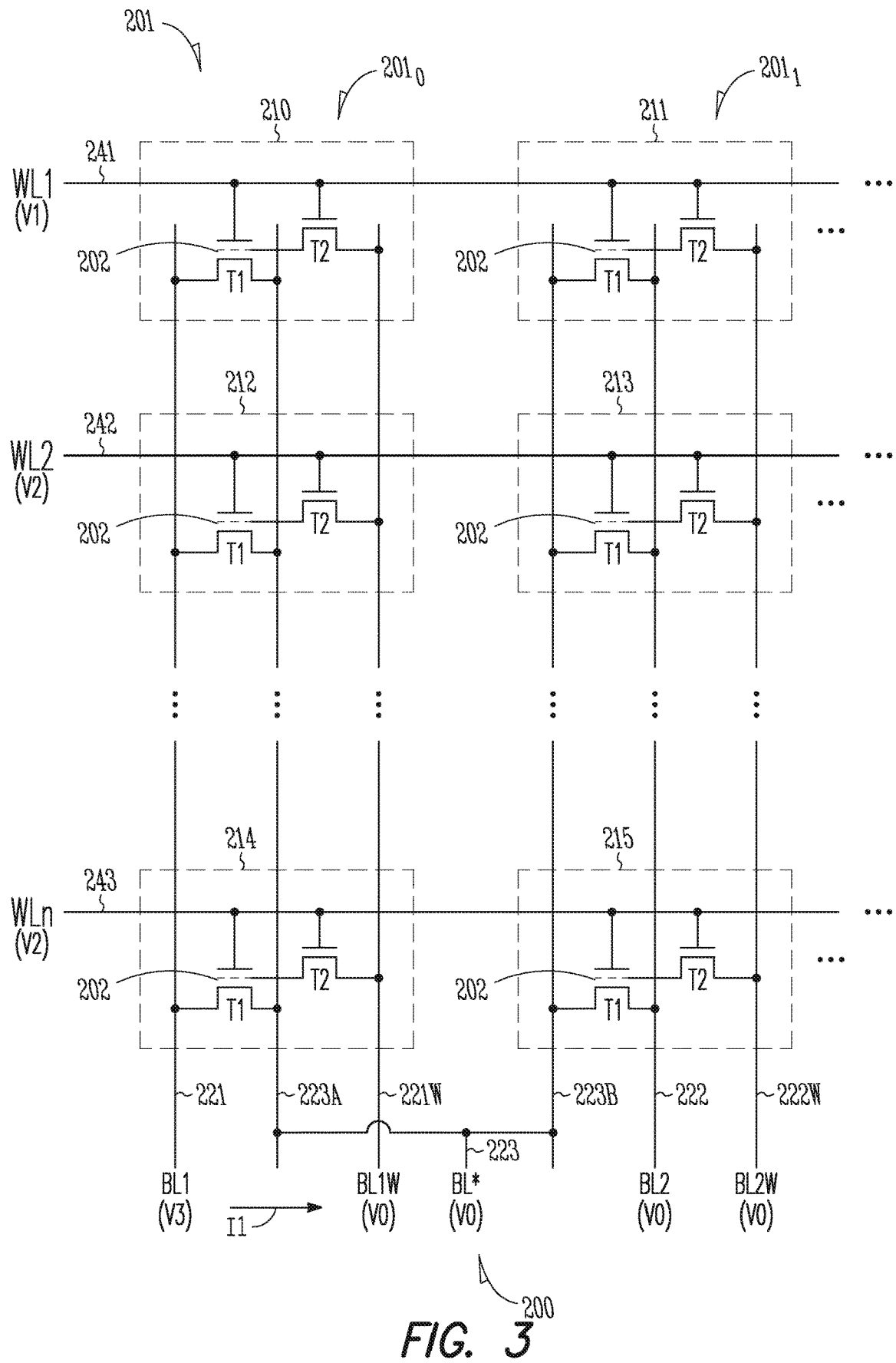
FIG. 3 shows the memory device of FIG. 2, including example voltages used during a read operation of the memory device, according to some embodiments described herein.

FIG. 3 shows memory device 200 of FIG. 2 including example voltages V0, V1, V2, and V3 used during a read operation of memory device 200, according to some embodiments described herein. The example of FIG. 3 assumes that memory cell 210 is a selected memory cell (e.g., target memory cell) during a read operation to read (e.g., to sense) information stored (e.g., previously stored) in memory cell 210. Memory cells 211 through 215 are assumed to be unselected memory cells. This means that memory cells 211 through 215 are not accessed, and information stored in memory cells 211 through 215 is not read, while information is read from memory cell 210 in the example of FIG. 3.

In FIG. 3, voltages V0, V1, V2, and V3 can represent different voltages applied to respective access lines 241, 242, and 243, and data lines 221, 222, 223, 221W, and 222W during a read operation of memory device 200. As an example, voltages V0, V1, V2, and V3 can have values of 0V (e.g., ground), −0.3V. −0.75V, and 0.5V, respectively. These values are example values. Different values may be used.

In the read operation shown in FIG. 3, voltage V1 can have a value (voltage value) to turn on transistor T1 of memory cell 210 (a selected memory cell in this example) and turn off (or keep off) transistor T2 of memory cell 210. This allows information to be read from memory cell 210. Voltages V0 and V2 can have values such that transistors T1 and T2 of each of memory cells 211 through 215 (unselected memory cells in this example) are turned off (e.g., kept off). Voltage V3 can have a value such that a current (e.g., read current) may be formed on a read path that includes data lines 221 and 223 and transistor T1 of memory cell 210. This allows a detection of current on the read path coupled to memory cell 210. Detection circuitry (not shown) of memory device 200 can operate to translate the value of detected current (during reading of information from a selected memory cell) into the value (e.g., "0", "1", or a combination of multi-bit values) of information read from the selected memory cell. In the example of FIG. 3, the value of detected current on data lines 221 and 223 can be translated into the value of information read from memory cell 210.

In the read operation shown in FIG. 3, the voltages applied to respective access lines 241, 242, and 243 can cause transistors T1 and T2 of each of memory cells 210 through 215, except transistor T1 of memory cell 210, to turn off (or to remain turned off). Transistor T1 of memory cell 210 may or may not turn on, depending on the value of the threshold voltage Vt1 of transistor T1 of memory cell 210. For example, if transistor T1 of each of the memory cells (e.g., memory cells 210 through 215) of memory device 200 is configured (e.g., structured) such that the threshold voltage of transistor T1 is less than zero (e.g., Vt1<0V) regardless of the value (e.g., the state) of information stored in a respective memory cell 210, then transistor T1 of memory cell 210, in this example, can turn on and conduct a current (e.g., current I1) between data lines 221 and 223 (through transistor T1 of memory cell 210). Memory device 200 can determine the value of information stored in memory cell 210 based on the value of the current (e.g., current I1) between data lines 221 and 223. As described above, memory device 200 can include detection circuitry to measure the value of current (e.g., current I1) between data lines 221 and 223 (or between data lines 222 and 223) during a read operation.

Figure 4:
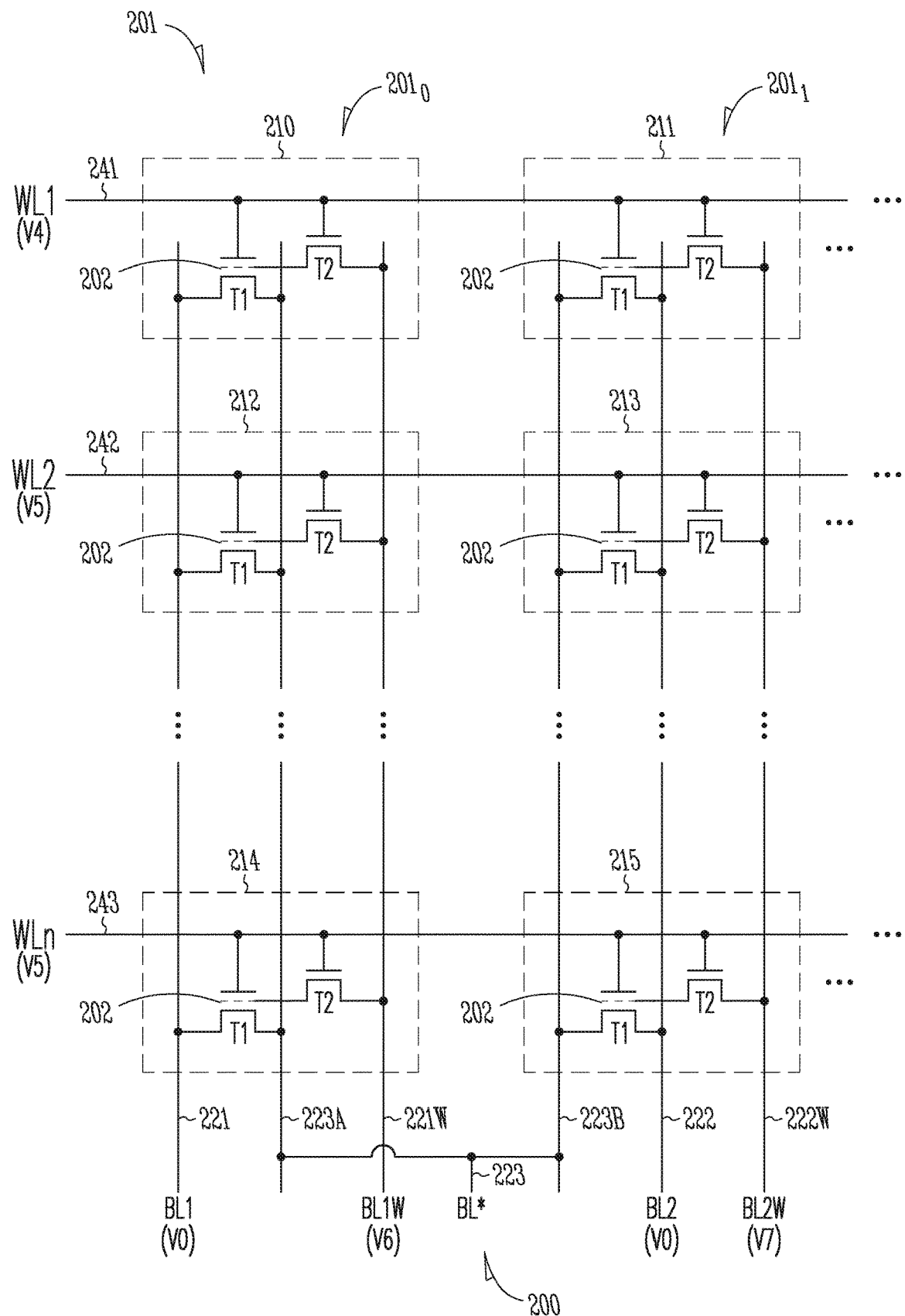
FIG. 4 shows the memory device of FIG. 2, including example voltages used during a write operation of the memory device, according to some embodiments described herein.

FIG. 4 shows memory device 200 of FIG. 2 including example voltages V0, V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed, and information is not to be stored in memory cells 212 through 215, while information is stored in memory cells 210 and 211 in the example of FIG. 4.

In FIG. 4, voltages V0, V4, V5, V6, and V7 can represent different voltages applied to respective access lines 241, 242, and 243, and data lines 221, 222, 221W and 222W during a write operation of memory device 200. As an example, voltages V0, V4, and V5 can have values of 0V, 3.3V, and −0.75V, respectively. The value of each of voltages V6 and V7 can be in the range from 0V to 3V, depending on the value (e.g., "0" or "1") of information to be stored in memory cells 210 and 211. The specific values of voltages used in this description are only example values. Different values may be used.

The values of voltages V6 and V7 can be the same or different, depending on the value (e.g., "0" or "1") of information to be stored in memory cells 210 and 211. For example, the values of voltages V6 and V7 can be the same (e.g., V6=V7) if memory cells 210 and 211 are to store information having the same value. As an example, V6=V7=0V, and V4=3.3V if information to be stored in each memory cell 210 and 211 is "0", and V6=V7=1V to 3V, and V4=3.3V if information to be stored in each memory cell 210 and 211 is "1".

In another example, the values of voltages V6 and V7 can be different (e.g., V6≠V7) if memory cells 210 and 211 are to store information having different values. As an example, V6=0V, V7=1V to 3V, and V4=3.3V if "0" is to be stored in memory cell 210 and "1" is to be stored in memory cell 211. As another example, V6=1V to 3V, V7=0V, and V4=3.3V if "1" is to be stored in memory cell 210 and "0" is to be stored in memory cell 211.

The range of voltages of 1V to 3V is used here as an example. A different range of voltages can be used. Further, instead of applying 0V (e.g., V6=0V or V7=0V) to a particular write data line (e.g., data line 221W or 222W) for storing information having a value of "0" to the memory cell (e.g., memory cell 210 or 211) coupled to that particular write data line, a positive voltage (e.g., V6>0V or V7>0V) may be applied to that particular write data line.

In a write operation of memory device 200 of FIG. 4, voltage V5 can have a value such that transistors T1 and T2 of each of memory cells 212 through 215 (unselected memory cells, in this example) are turned off (e.g., kept off). Voltage V4 can have a value to turn on transistor T2 of each of memory cells 210 and 211 (selected memory cells, in this example) and form a write path between charge storage structure 202 of memory cell 210 and data line 221W, and a write path between charge storage structure 202 of memory cell 211 and data line 222W. A current (e.g., write current) may be formed between charge storage structure 202 of memory cell 210 and data line 221W. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 and data line 222W. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

The example write operation of FIG. 4 assumes that memory cells 210 and 211 are selected (e.g., concurrently selected) to store (e.g., concurrently store) information. In another write operation, either memory cell 210 or memory cell 211 can be selected to store information. For example, in another write operation, memory cell 210 can be selected and memory cells 211 through 215 can be unselected memory cells. In such a write operation, voltage V7 can represent a voltage (e.g., a write inhibit voltage (e.g., V7=V4)) such that memory cell 211 is inhibited from storing information when information is stored in memory cell 210 (e.g., the selected memory cell). Similarly, if memory cell 211 is selected to store information and memory cells 210 and 212 through 215 are unselected memory cells, then voltage V6 can represent a voltage (e.g., a write inhibit voltage (e.g., V6=V4)) such that memory cell 210 is inhibited from storing information when information is stored in memory cell 211 (e.g., the selected memory cell).

Figure 5:
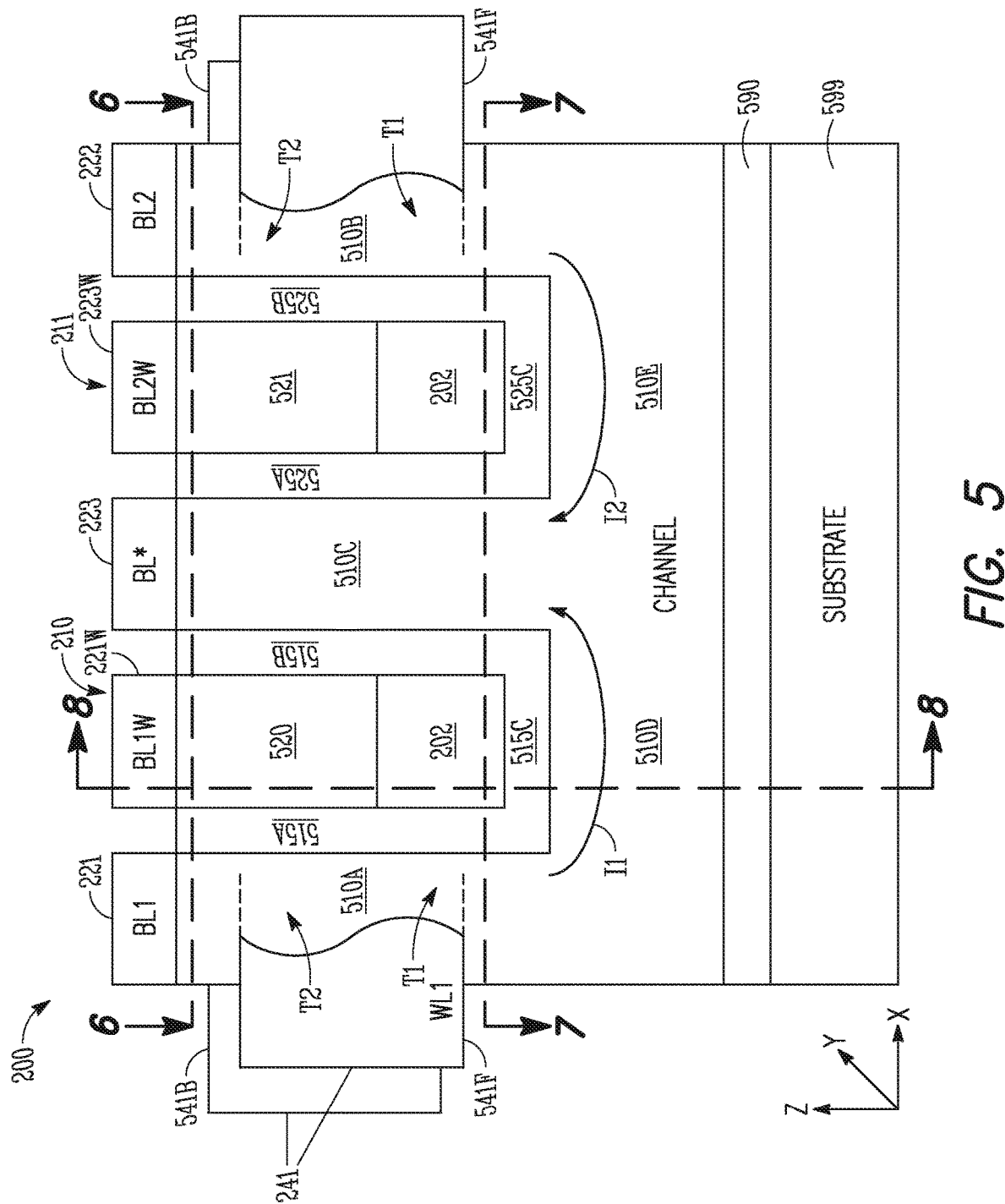
FIG. 5, FIG. 6, FIG. 7, and FIG. 8 show different views of a structure of the memory device of FIG. 2, according to some embodiments described herein.
Figure 6:
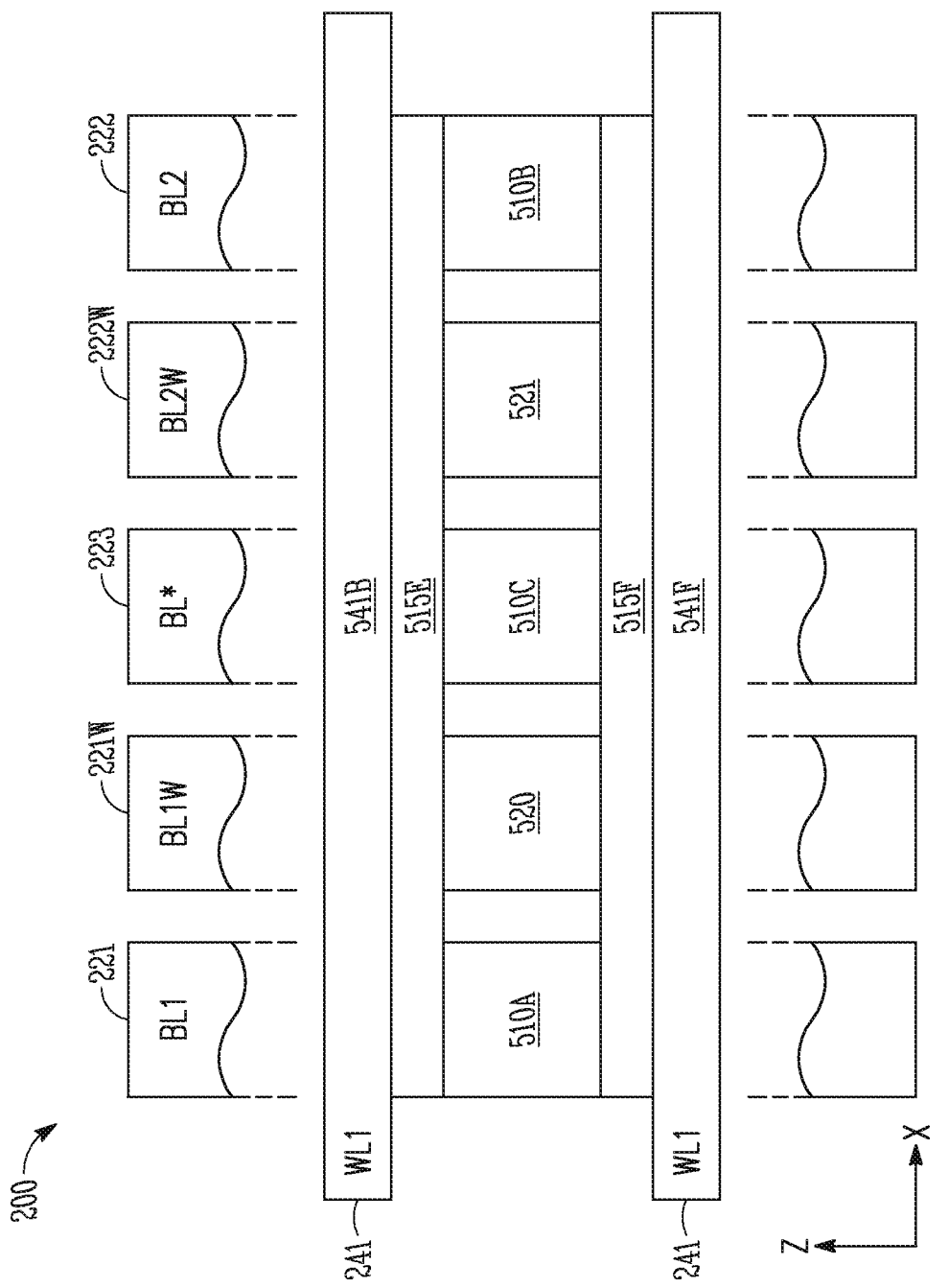
Figure 7:
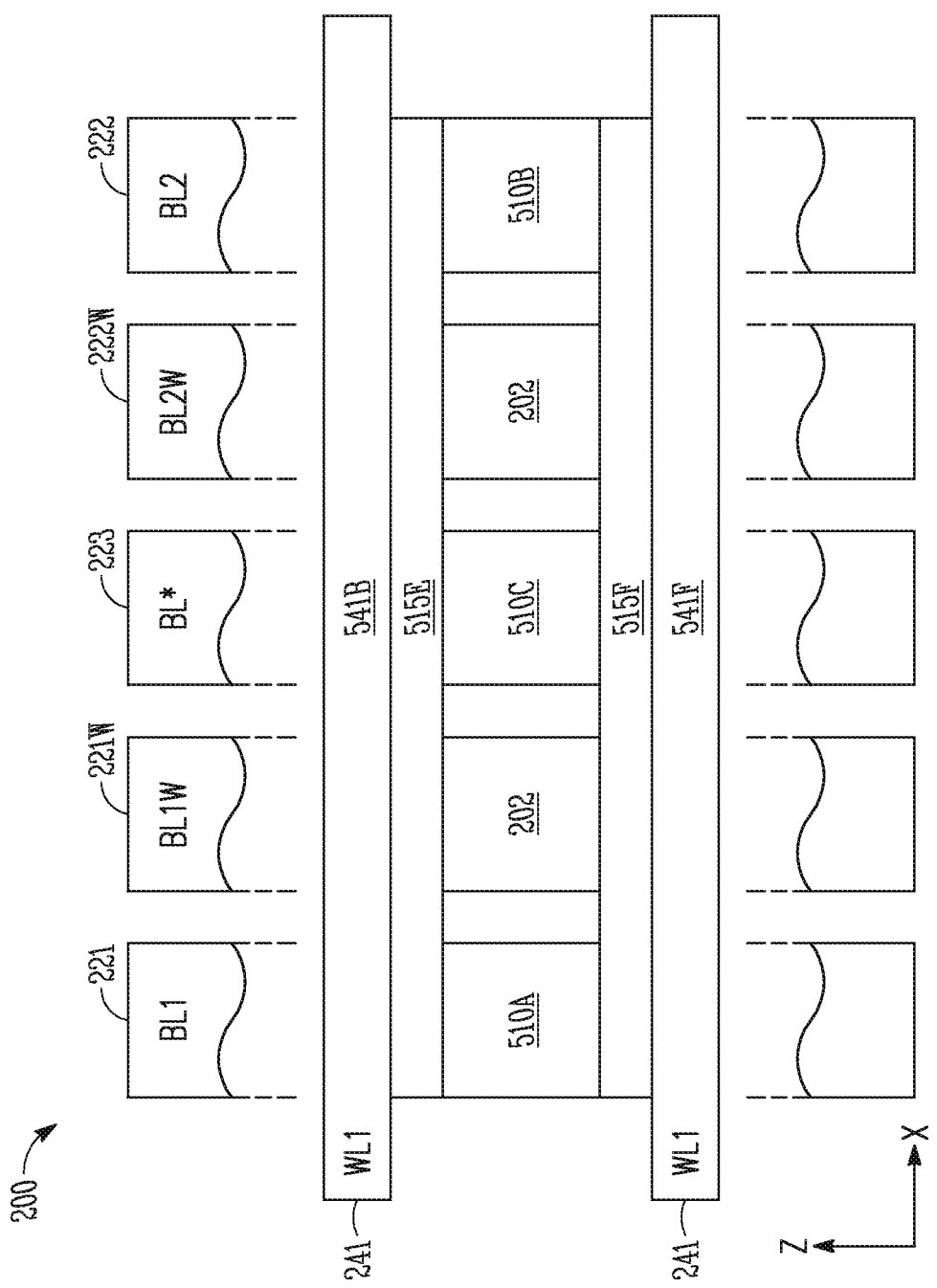
Figure 8:
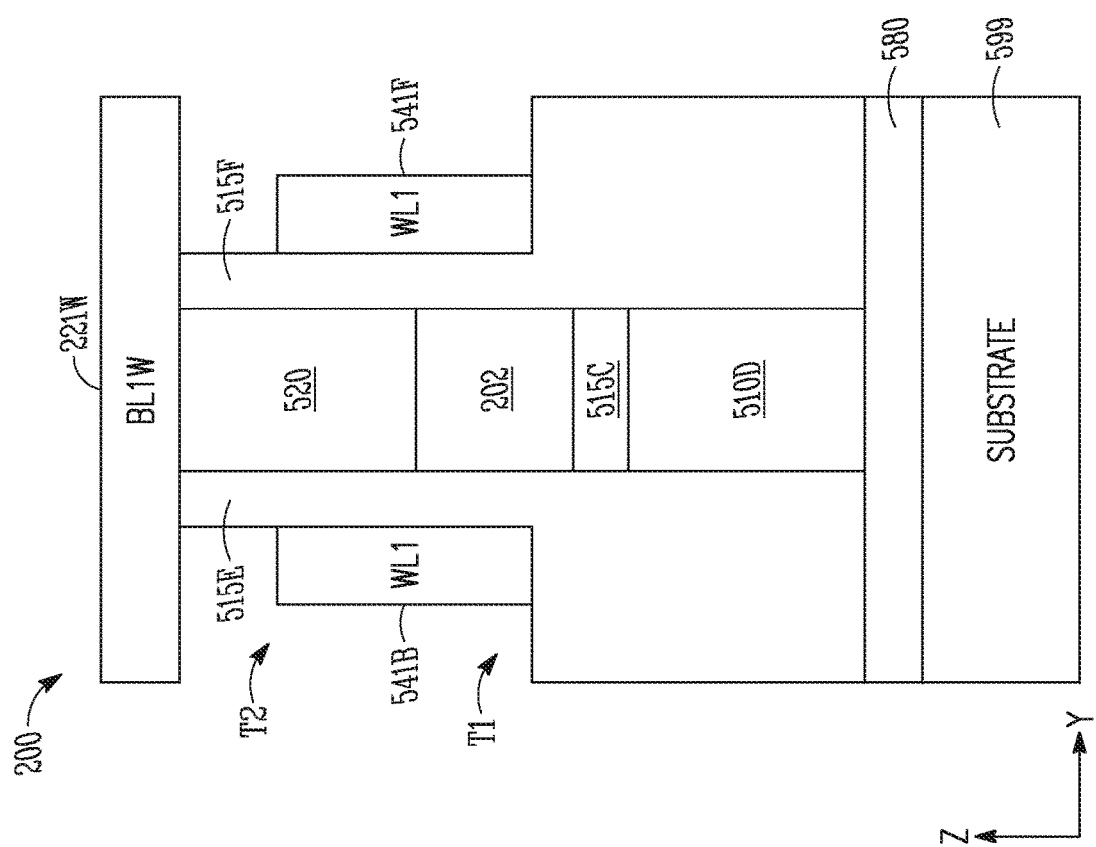

FIG. 5, FIG. 6, FIG. 7, and FIG. 8 show different views of a structure of memory device 200 of FIG. 2 with respect to the X, Y, and Z directions, according to some embodiments described herein. FIG. 5 shows a side view of memory device 200 with respect to the X-Z directions. FIG. 6, FIG. 7, and FIG. 8 show views taken along lines 6-6, 7-7, and 8-8, respectively, of FIG. 5.

For simplicity, FIG. 5 through FIG. 8 focus on the structure of memory cells 210 and 211. The structures of other memory cells (e.g., memory cells 212, 213, 214, and 215) of memory device 200 of FIG. 2 can be similar to or identical to the structures of memory cells 210 and 211 shown in FIG. 5. In FIG. 5 through FIG. 8 (which show the physical structure of memory device 200) and FIG. 2 (which shows memory device 200 in circuit schematic form), the same elements are given the same reference numbers.

The following description refers to FIG. 5 through FIG. 8. For simplicity, detailed description of the same element is not repeated in the descriptions of FIG. 5 through FIG. 8. Also for simplicity, cross-sectional lines (e.g., hatch lines) are omitted from most of the elements shown in FIG. 5 through FIG. 8 and other figures (e.g., FIG. 9 through FIG. 20) in the drawings described herein. Some elements of memory device 200 may be omitted from a particular figure of the drawings so as to not obscure the description of the element being described in that particular figure. The dimensions of the elements shown in FIG. 5 through FIG. 8 are not scaled.

As shown in FIG. 5, memory device 200 can include a substrate 599 over which memory cells 210 and 211 can be formed (e.g., formed vertically in the Z-direction with respect to substrate 599). Substrate 599 can be a semiconductor substrate (e.g., silicon-based substrate) or other types of substrates. The Z-direction can be a direction perpendicular to substrate 599 (e.g., a vertical direction relative to substrate 599). The X-direction and the Y-direction are perpendicular to each other and perpendicular to the Z-direction.

As shown in FIG. 5 through FIG. 8, each of data lines (e.g., read bit lines) 221, 222, and 223 (associated with signals BL1, BL2, and BL*, respectively), and data lines (e.g., write bit lines) 221W and 222W (associated with signals BL1W and BL2W, respectively) can have a length in the Y-direction, a width in the X-direction, and a thickness in the Z-direction. Each of data lines 221, 222, 223, 221W, and 222W can include a conductive material (or a combination of materials) that can be structured as a conductive line (e.g., conductive region). Example materials for data lines 221, 222, 223, 221W, and 222W include metal, conductively doped polysilicon, or other conductive materials.

As shown in FIG. 5, data lines 221, 222, 223, 221W, and 222W can include respective conductive regions (e.g., parts of respective conductive materials that form data lines 221, 222, 223, 221W, and 222W) electrically separated from each other and located in the same level over substrate 599.

Access line 241 (associated with signal WL1) can be structured by (e.g., can include) a combination of portions 541F and 541B (e.g., front and back conductive portions with respect to the Y-direction). In FIG. 5, portions 541F and 541B are partially shown to avoid obstructing some parts of the other elements of memory device 200.

Each of portions 541F and 541B can include a structure of conductive material (e.g., a piece of material (a layer of material)). Examples of the conductive material include metal, conductively doped polysilicon, or other conductive materials. Each of portions 541F and 541B can include a conductive material (or a combination of materials) that can be structured as a conductive line (e.g., conductive region) having a length extending continuously in the X-direction, a width (shown in FIG. 5) in the Z-direction, and a thickness (shown in FIG. 8) in the Y-direction.

Portions 541F and 541B can be electrically coupled to each other. For example, memory device 200 can include a conductive material (e.g., not shown) that can contact (e.g., electrically couple to) portions 541F and 541B, such that the same signal (e.g., signal WL1) can be concurrently applied to portions 541F and 541B (which are part of a shared (or single) access line 241).

In an alternative structure of memory device 200, either portion 541F or portion 541B can be omitted, such that access line 241 can include only either portion 541F or portion 541B. In the structure shown in FIG. 5, including two portions 541F and 541B can help better control transistor T1 (e.g., transistor T1, shown schematically in FIG. 2) of each of memory cells 210 and 211 during a read operation.

As shown in FIG. 5, memory device 200 can include a dielectric 590 formed over a portion of substrate 599. Dielectric 590 can include silicon oxide. In FIG. 5, the region labeled "CHANNEL" can present at least part of a channel region (e.g., read channel region) of the memory cells (e.g., part of a read channel of memory cell 210 and memory cell 211) of memory device 200 shown in FIG. 5. Dielectric 590 can electrically separate the elements (e.g., the channel regions) of the memory cells (e.g., memory cells 210 and 211) of memory device 200 from substrate 599.

Charge storage structure 202 can include a structure of semiconductor material, which can include a piece (e.g., a layer) of semiconductor material (e.g., polysilicon), a piece (e.g., a layer) of metal, or a piece of material (or materials) that can trap charge. The materials for charge storage structure 202 and portions 541F and 541B of access line 241 can be the same or can be different. As shown in FIG. 5, charge storage structure 202 can be located on a level over substrate 599 and below (with respect to the Z-direction) the level on which data lines 221, 222, 223, 221W, and 222W are located. Thus, charge storage structure 202 is located between substrate 599 and the level on which data lines 221, 222, 223, 221W, and 222W are located.

As shown in FIG. 5, charge storage structure 202 can be closer (e.g., can extend in the Z-direction closer) to substrate 599 than each of portions 541F or 541B. For example, as shown in FIG. 5, a distance in the Z-direction between substrate 599 and an edge (e.g., bottom edge with respect to the Z-direction) of the material that forms charge storage structure 202 is less than (e.g., shorter than) a distance in the Z-direction between substrate 599 and an edge (e.g., bottom edge with respect to the Z-direction) of the material that forms each of portions 541F and 541B.

FIG. 5 shows an example where the top edge of charge storage structure 202 is at a specific distance (e.g., distance shown in FIG. 5) from the edge (e.g., bottom edge) of each of portions 541F and 541B of access line 241. However, the distance between the top edge of charge storage structure 202 and the edge (e.g., bottom edge) of each of portions 541F and 541B may vary.

FIG. 5 shows an example where portions 541F and 541B overlap (in the Z-direction) charge storage structure 202. However, portions 541F and 541B may not overlap charge storage structure 202.

Memory device 200 can include material 520 located on a level over the level on which charge storage structure 202 is located, such that charge storage structure 202 is between material 520 and substrate 599. Material 520 can be electrically coupled to data line (e.g., write bit line) 221W and charge storage structure 202 of memory cell 210. As described above, charge storage structure 202 of memory cell 210 can form the memory element of memory cell 210. Thus, as shown in FIG. 5, memory cell 210 can include a memory element (which is charge storage structure 202) located between substrate 599 and material 520 with respect to the Z-direction, and the memory element contacts (e.g., is directly coupled to) material 520.

Material 520 can form a source (e.g., source terminal), a drain (e.g., drain terminal), and a channel region (e.g., write channel region) between the source and the drain of transistor T2 of memory cell 210. Thus, as shown in FIG. 5, the source, the channel region, and the drain of transistor T2 of memory cell 210 can be formed from a single structure (e.g., a single piece) of the same material (or alternatively a single structure (e.g., a single piece of the same combination of materials), such as material 520. Therefore, the source, the drain, and the channel region of transistor T2 of memory cell 210 can be formed from the same material (e.g., material 520) of the same conductivity type (e.g., either n-type or p-type).

Memory device 200 can include material 521 that can form a source (e.g., source terminal), a drain (e.g., drain terminal), and a channel region (e.g., write channel region) between the source and the drain of transistor T2 of memory cell 211. Thus, as shown in FIG. 5, the source, the channel region, and the drain of transistor T2 of memory cell 211 can be formed from a single structure (e.g., a single piece) of the same material (or alternatively, a single piece of the same combination of materials), such as material 521.

Materials 520 and 521 can be the same. For example, each of materials 520 and 521 can include a piece (e.g., a layer) of semiconductor material. The piece of semiconductor material can include a piece of oxide material. Examples of the oxide material used for materials 520 and 521 include semiconducting oxide materials, transparent conductive oxide materials, and other oxide materials.

As an example, each of materials 520 and 521 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the material listed above in memory device 200 provides improvement and benefits for memory device 200. For example, during a read operation, to read information from a selected memory cell (e.g., memory cell 210 or 211), charge from charge storage structure 202 of the selected memory cell may leak to transistor T2 of the selected memory cell. Using the material listed above for the channel region (e.g., material 520 or 521) of transistor T2 can reduce or prevent such a leakage. This improves the accuracy of information read from the selected memory cell and improves the retention of information stored in the memory cells of the memory device (e.g., memory device 200) described herein.

The materials listed above are examples of materials 520 and 521. However, other materials (e.g., a relatively high band-gap material) different from the above-listed materials can be used.

In FIG. 5, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In another example, material 520 can be electrically coupled to charge storage structure 202 of memory cell 210, such that material 520 is not directly coupled to (e.g., not contacting) charge storage structure 202 of memory cell 210, but material 520 is coupled to (e.g., indirectly contacting) charge storage structure 202 of memory cell 210 through an intermediate material (e.g., a conductive material, not shown in FIG. 5) between charge storage structure 202 of memory cell 210 and material 520.

As shown in FIG. 5, memory device 200 can include portions 510A, 510B, 510C, 510D, and 510E electrically coupled to each other, and portions (e.g., dielectric portions) 515A, 515B, 515C. 525A, 525B, and 525C. Portions 515A, 515B, and 515C can include a dielectric material and can be gate oxide regions of memory cell 210 that electrically separate each of material 520 and charge storage structure 202 of memory cell 210 from portions 510A, 510C, and 510D. Portions 525A, 525B, and 525C can include a dielectric material and can be gate oxide regions of memory cell 211 that electrically separate each of material 521 and charge storage structure 202 of memory cell 211 from portions 510B, 510E, and 510C. Example materials for portions 515A, 515B, 515C, 525A, 525B, and 525C can include silicon dioxide, hafnium oxide (e.g., $HfO_2$), hafnium oxide (e.g., $HfO_2$), aluminum oxide (e.g., (e.g., $Al_2O_3$), or other dielectric materials.

Each of portions 510A, 510B, 510C, 510D, and 510E can include a structure (e.g., a piece) of semiconductor material. Example materials for each of portions 510A, 510B, 510C, 510D, and 510E include silicon, polysilicon (e.g., undoped or doped polysilicon), germanium, silicon-germanium, or other semiconductor materials.

As described below, portion 510C can be shared between transistor T1 of memory cell 210 and transistor T1 of memory cell 211. Data line 223 can be shared between memory cells 210 and 211 to conduct current I1 between data lines 221 and 223 (through portions 510A, 510D, and 510C) and current I2 between data lines 222 and 223 (through portions 510B, 510E, and 510C).

As described above with reference to FIG. 2, transistor T1 of memory cell 210 includes a channel region (e.g., read channel region). In FIG. 5, the channel region of transistor T1 of memory cell 210 can include at least part of each of portions 510A, 510D, and 510C. Portions 510A, 510D, and 510C can be electrically coupled to data lines 221 and 223. As described above with reference to FIG. 2, memory cell 210 can include a read path. In FIG. 5, portions 510A, 510D, and 510C (e.g., the read channel region of transistor T1 of memory cell 210) can be part of the read path of memory cell 210 that can carry current I1 (e.g., a read current) during a read operation of reading information from memory cell 210. For example, during a read operation, to read information from memory cell 210, portions 510A, 510D, and 510C can conduct current I1 between data lines 221 and 223. The direction of current I1 can be from data line 221 to data line 223 (through portions 510A, 510D, and 510C).

Thus, as shown in FIG. 5, transistor T1 of memory cell 210 can include a channel region (e.g., read channel region) formed from portions 510A, 510D, and 510C. Portion 510A can be located on (e.g., adjacent) a side (e.g., left side in the X-direction) of charge storage structure 202 (e.g., memory element) and material 520 (e.g., write channel region of transistor T2) of memory cell 210. Portion 510C can be located on (e.g., adjacent) a side (e.g., right side (opposite from the left side) in the X-direction) of charge storage structure 202 and material 520 of memory cell 210. Portion 510D can be located on (e.g., adjacent) a side (e.g., bottom side in the Z-direction) of charge storage structure 202 of memory cell 210 and on a level (in the Z-direction) between charge storage structure 202 of memory cell 210 and substrate 599.

As described above with reference to FIG. 2, transistor T1 of memory cell 211 includes a channel region (e.g., read channel region). In FIG. 5, the channel region of transistor T1 of memory cell 211 can include at least part of each of portions 510B, 510E, and 510C. Portions 510B, 510E, and 510C can be electrically coupled to data lines 222 and 223. As described above with reference to FIG. 2, memory cell 211 can include a read path. In FIG. 5, portions 510B, 510E, and 510C (e.g., the read channel region of transistor T1 of memory cell 211) can be part of the read path of memory cell 211 that can carry current I2 (e.g., a read current) during a read operation of reading information from memory cell 211. For example, during a read operation to read information from memory cell 211, portions 510B, 510E, and 510C can conduct current I2 between data lines 222 and 223. The direction of current I2 can be from data line 222 to data line 223 (through portions 510B, 510E, and 510C).

Thus, as shown in FIG. 5, transistor T1 of memory cell 211 can include a channel region formed from portions 510B, 510E, and 510C. Portion 510B can be located on (e.g., adjacent) a side (e.g., right side in the X-direction) of charge storage structure 202 (e.g., memory element) and material 521 (e.g., write channel region of transistor T2) of memory cell 211. Portion 510C can be located on (e.g., adjacent) a side (e.g., left side (opposite from the right side) in the X-direction) of charge storage structure 202 and material 521 of memory cell 211. Portion 510D can be located on (e.g., adjacent) a side (e.g., bottom side in the Z-direction) of charge storage structure 202 of memory cell 211 and on a level (in the Z-direction) between charge storage structure 202 of memory cell 211 and substrate 599.

As shown in FIG. 5, part of portion 541F can span across (e.g., overlap in the X-direction) part of portions 510A and 510C and part of material 520. As described above, portions 510A and 510C can form part of a read channel region of transistor T1 of memory cell 210, and material 520 can form part of a write channel region of transistor T2 of memory cell 210. Thus, as shown in FIG. 5, part of portion 541F can span across (e.g., overlap) part of (e.g., on a side (e.g., front side) in the Y-direction) both read and write channel regions of transistors T1 and T2, respectively, of memory cell 210. Although hidden from the view shown in FIG. 5, part of portion 541B can span across (e.g., overlap in the X-direction) part of (e.g., on another side (e.g., back side opposite from the front side) in the Y-direction) portions 510A and 510C and a part of material 520 of memory cell 210. As shown in FIG. 5, portions 541F and 541B of access line 241 can also span across (e.g., overlap in the X-direction) part of portions 510B and 510C (e.g., the read channel region of transistor T1 of memory cell 211) and part of material 521 (e.g., the write channel region of transistor T2 of memory cell 211).

The spanning (e.g., overlapping) of access line 241 across portions 510A and 510C and materials 520 and 521 allows access line 241 (e.g., a shared access line) to control (e.g., turn on or turn off) both transistors T1 and T2 of memory cell 210. The spanning (e.g., overlapping) of access line 241 across portions 510B and 510C also allows access line 241 to control (e.g., turn on or turn off) both transistors T1 and T2 of memory cell 211.

As shown in FIG. 6 through FIG. 8, memory device 200 can include portions (e.g., dielectric portions) 515E and 515F (e.g., oxide regions) to electrically separate portions 541F and 541B of access line 241 from other elements (e.g., from portions 510A, 510B, 510C, 510D, and 510E (e.g., read channel regions) and from charge storage structure 202) memory cells 210 and 211. Example materials for portions 515E and 515F can include silicon dioxide, hafnium oxide (e.g., $HfO_2$), aluminum oxide (e.g., (e.g., $Al_2O_3$), or other dielectric materials.

The dielectric material (or materials) separating portions 510A, 510B, 510C, 510D, and 510E (the read channel regions) from portions 541F and 541B of access line 241 can be the same as (or alternatively, different from) the material (or materials) separating charge storage structure 202 from portions 541F and 541B of access line 241. Further, the thickness of the dielectric material (or materials) separating portions 510A, 510B, 510C, 510D, and 510E (the read channel regions) from portions 541F and 541B of access line 241 can be the same as (or alternatively, different from) the thickness of the material (or materials) separating charge storage structure 202 from portions 541F and 541B of access line 241.

As shown in FIG. 8, portions 541F and 541B can be adjacent respective sides of material 520 (e.g., the write channel region) and charge storage structure 202 of memory cell 210. For example, portion 541F can be located on (e.g., adjacent) a side (e.g., right side in the X-direction in the view of FIG. 8) of a portion of each of material 520 and charge storage structure 202. In another example, portion 541B can be located on (e.g., adjacent) another side (e.g., left side (opposite from the right side) in the X-direction in the view of FIG. 8) of a portion of each of material 520 and charge storage structure 202.

FIG. 9 through FIG. 19 show cross-sectional views of elements during processes of forming a memory device 900, according to some embodiments of described herein. Some or all of the processes used to form memory device 900 can be used to form memory device 200 described above with reference to FIG. 2 through FIG. 8.

Figure 9:
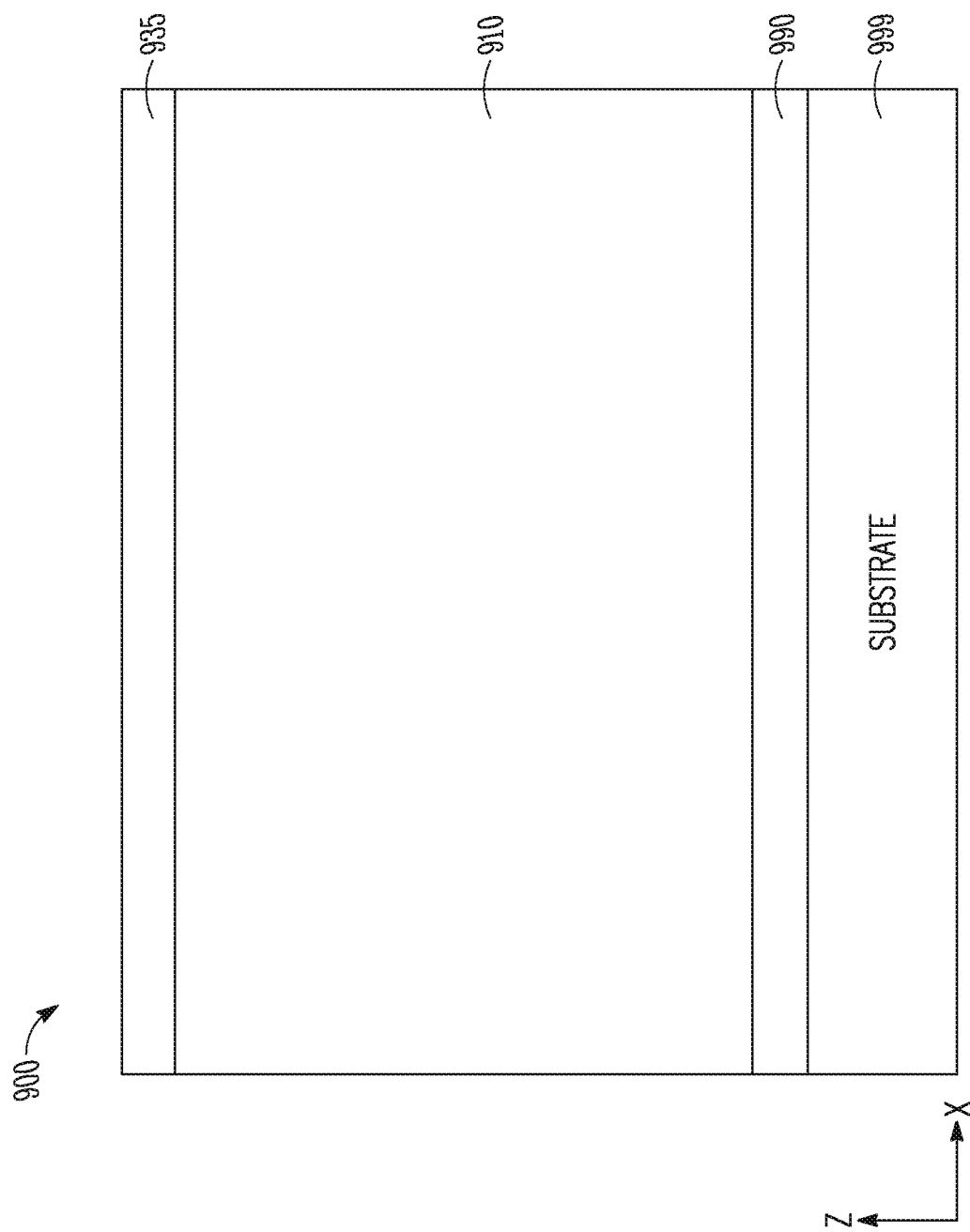
FIG. 9 through FIG. 19 show processes of forming a memory device, according to some embodiments described herein.

FIG. 9 shows memory device 900 after a dielectric material 990, a semiconductor material 910, and a dielectric material 935 are formed in respective levels (e.g., layers) in the Z-direction over a substrate 999. The Z-direction (e.g., vertical direction) is a direction perpendicular to (e.g., outward from) substrate 999. The Z-direction is also perpendicular to the X-direction. Substrate 999 can be similar to or identical to substrate 599 of FIG. 5. Dielectric material 990 can include an oxide material (e.g., silicon dioxide, $SiO_2$). The material for semiconductor material 910 can be the same as the material for each of portions 510A, 510B, 510C, 510D, and 510E (FIG. 5). Dielectric material 990, semiconductor material 910, and dielectric material 935 can be formed in a sequential fashion one material after another over substrate 999. For example, the processes used in FIG. 9 can include forming (e.g., depositing) dielectric material 990 over substrate 999, forming (e.g., depositing) semiconductor material 910 over dielectric material 990, and forming (e.g., depositing) dielectric material 935 (e.g., silicon nitride, $SiN_4$) over semiconductor material 910.

Figure 10:
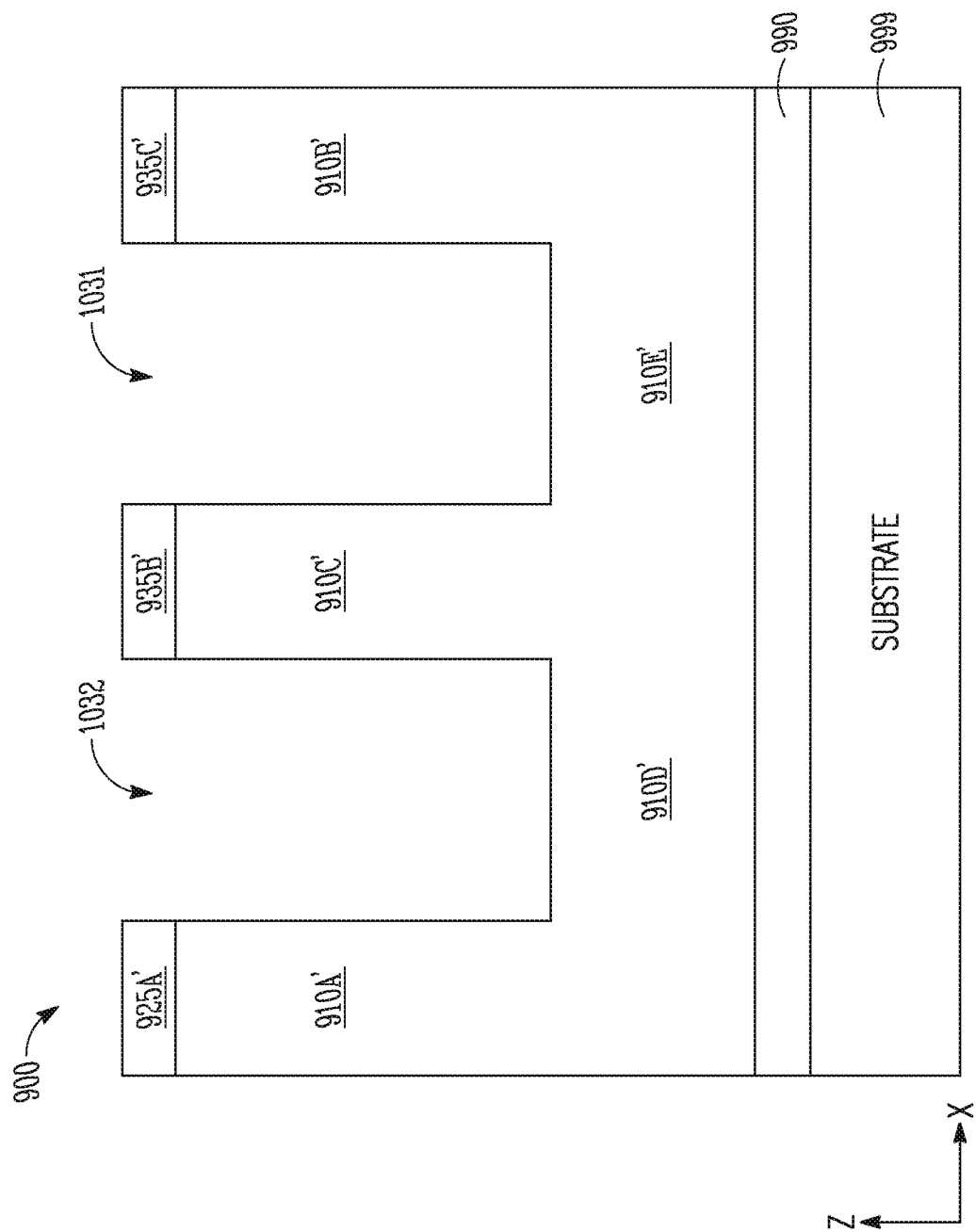

FIG. 10 shows memory device 900 after openings (e.g., trenches) 1031 and 1032 and portions 910A', 910B', 910C', 910D', and 910E' are formed. Forming openings 1031 and 1032 can include removing (e.g., by patterning) part of dielectric material 935 and part of semiconductor material 910 at the locations of openings 1031 and 1032. Portions 935A', 935B', and 935C' are remaining parts of dielectric material 935. Portions 910A', 910B', 910C', 910D', and 910E' are remaining parts of semiconductor material 910.

Figure 11:
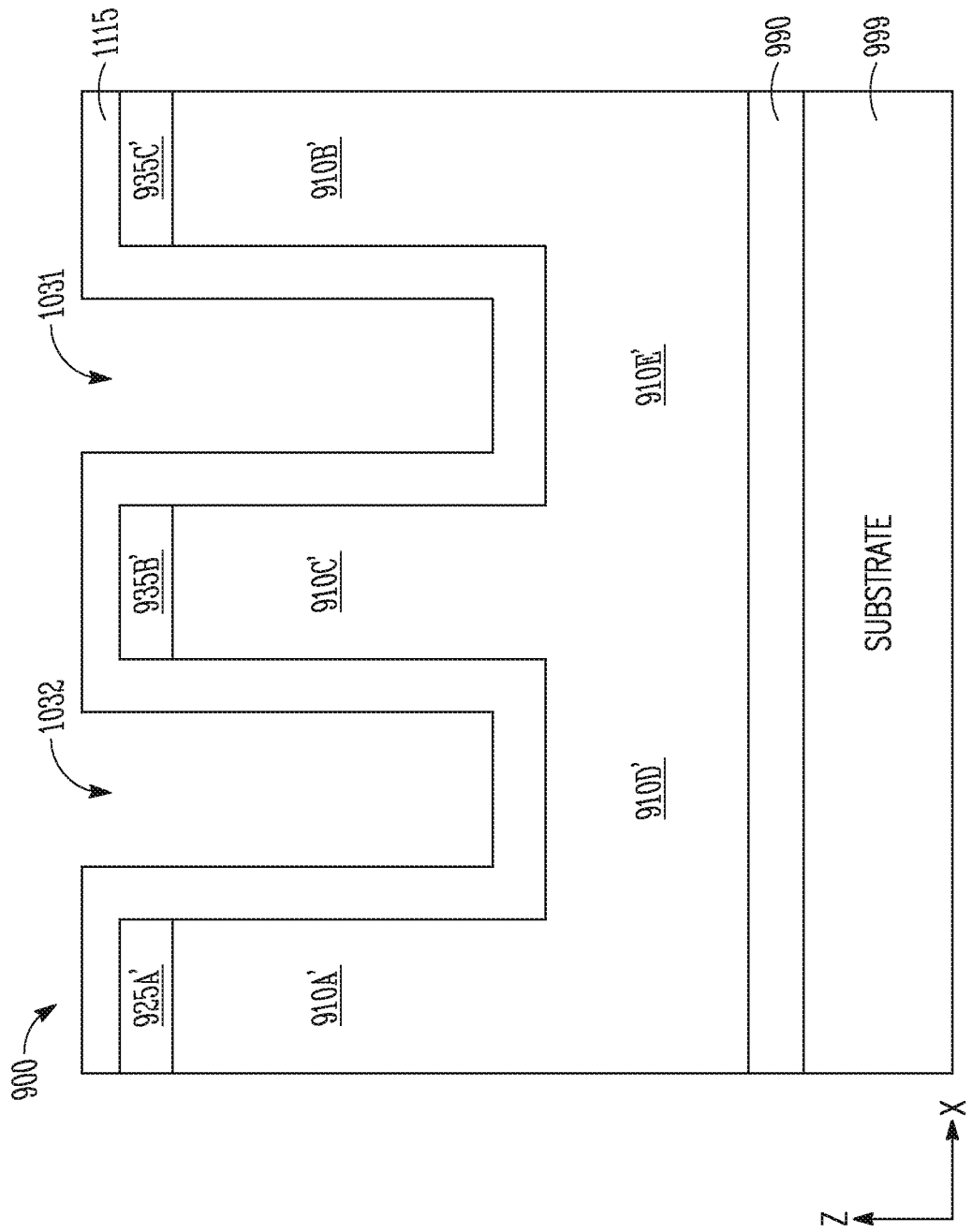

FIG. 11 shows memory device 900 after a dielectric material 1115 is formed. Dielectric material 1115 can include an oxide material (e.g., silicon dioxide. $SiO_2$).

Figure 12:
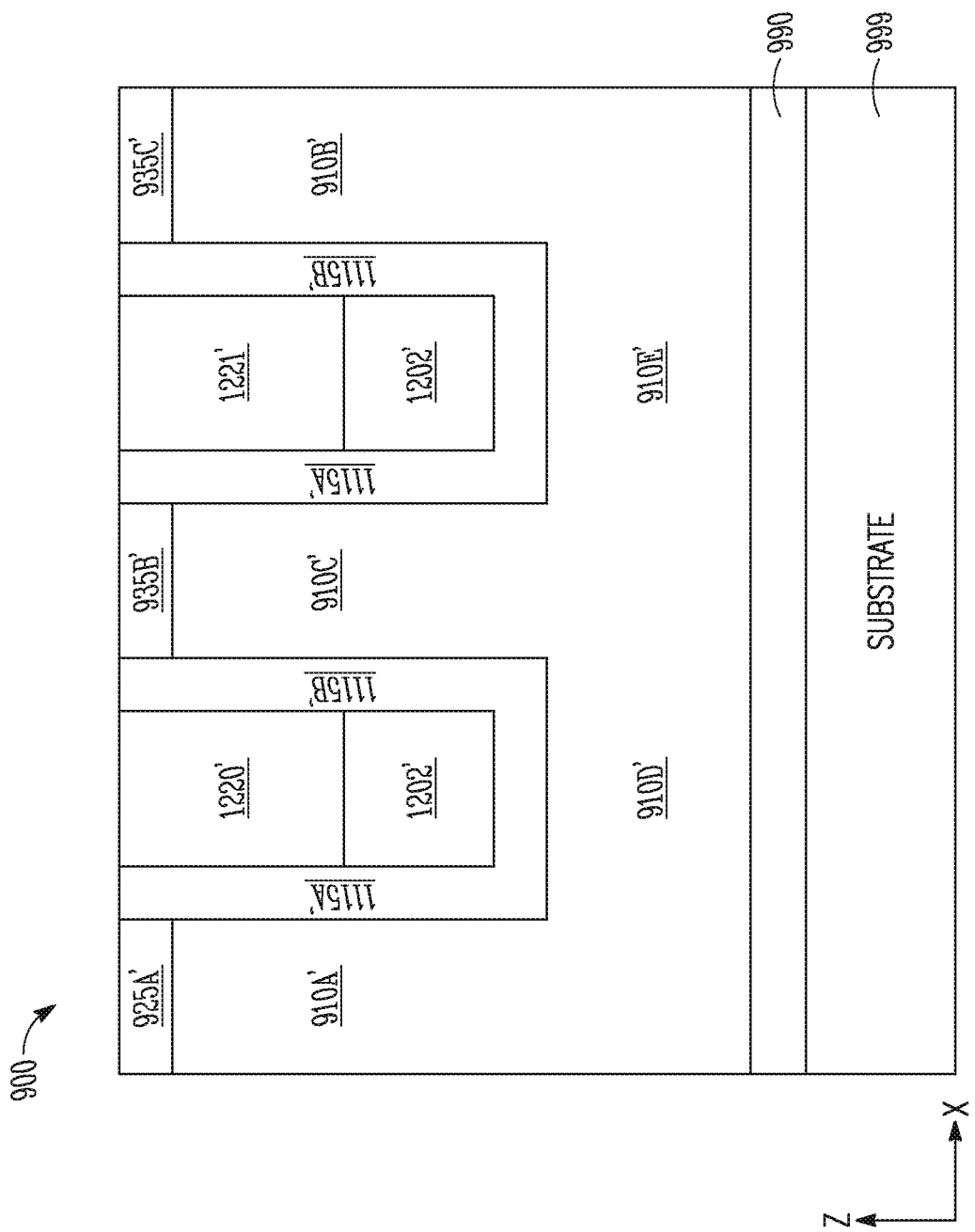

FIG. 12 shows memory device 900 after materials 1202', 1220', and 1221', and portions 1115A', 1115B', and 1115C' are formed. The processes in FIG. 12 can include a flattening process (e.g., chemical mechanical polishing (CMP) process) to remove part (e.g., a top part) of dielectric material 1115. The remaining part of dielectric material 1115 is portions 1115A', 1115B', and 1115C'.

The processes in FIG. 12 can include forming (e.g., depositing) material 1202' on dielectric material 1115 (FIG. 11) at locations of openings 1031 and 1032 (FIG. 10). As described below, in subsequent processes of forming memory device 900, material 1202' can be structured to form a charge storage structure (e.g., a memory element) of a respective memory cell of memory device 900. Material 1202' can include a material (e.g., polysilicon) similar to or identical to the material of charge storage structure 202 of the memory cells (e.g., memory cell 210 or 211) of memory device 200 (FIG. 2).

The processes in FIG. 12 can include forming (e.g., depositing) material 1220' on (e.g., directly on) material 1202' at the location of opening 1032, and forming (e.g., depositing) material 1221' on (e.g., directly on) material 1202' at the location of opening 1031. Materials 1220' and 1221' can be the same material. Materials 1220' and 1221' can be formed (deposited) at the same time. Materials 1220' and 1221' can include materials similar to or identical to material 520 or 521 (FIG. 5) (e.g., a write channel region) of transistor T2 of memory device 200 of FIG. 2. As described below, in subsequent processes of forming memory device 900, each of materials 1220' and 1221' can form a channel region (e.g., write channel region) of a transistor (e.g., transistor T2) of a respective memory cell of memory device 900.

Figure 13:
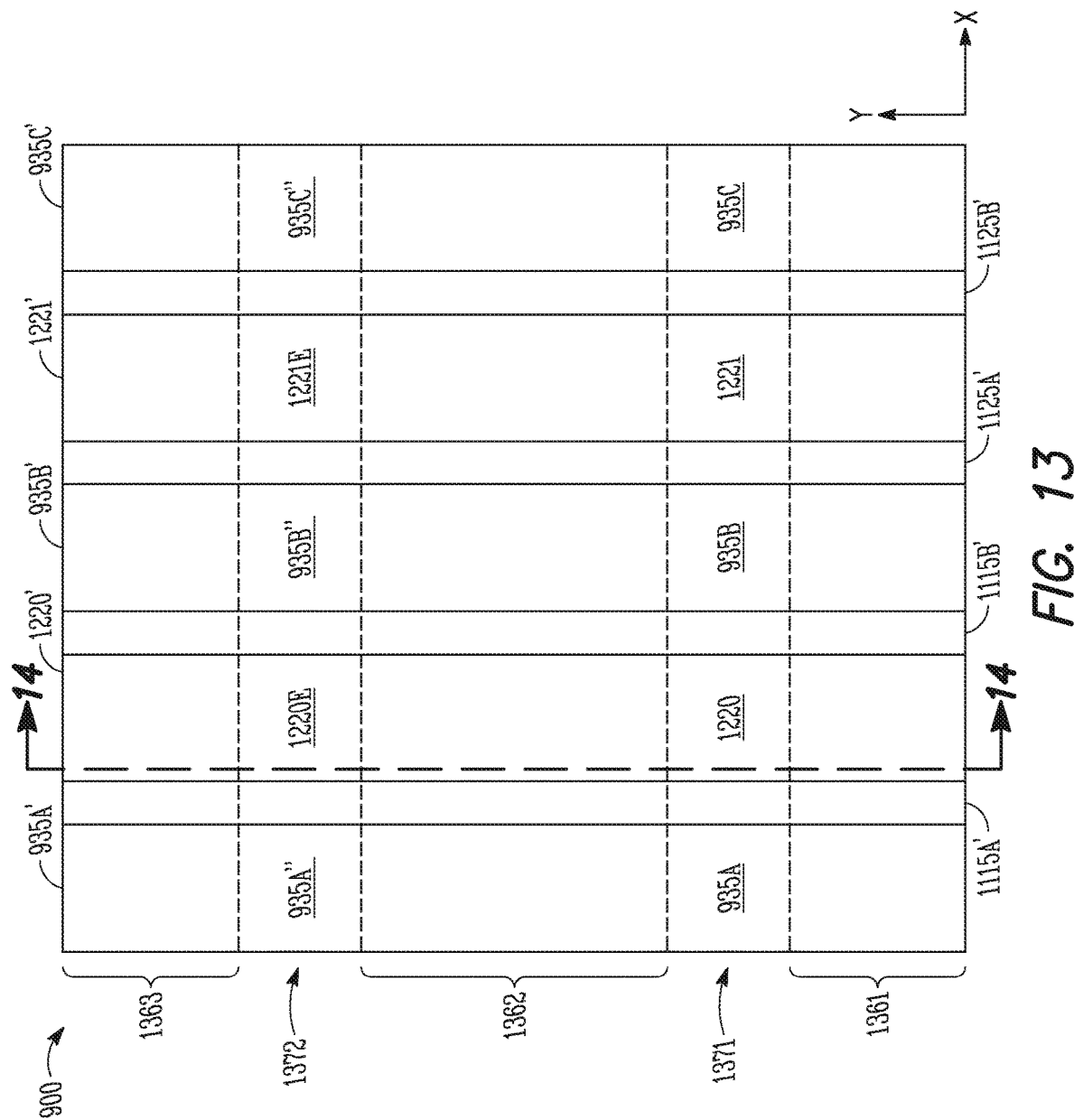

FIG. 13 shows a top view with respect to the X-Y directions of memory device 900 of FIG. 9. For simplicity, the description of the elements shown in FIG. 13 (which are described with reference to FIG. 12) is not repeated. As shown in FIG. 13, the elements of memory device 900 can include strips (e.g., lines) of materials having lengths extending in the Y-direction. Subsequent processes of forming memory device 900 can include removing (e.g., cutting (e.g., etching) in the Z-direction) the materials at locations 1361, 1362, and 1363 down to (e.g., stopping at) dielectric material 990 (FIG. 9).

In FIG. 13, after part of the materials at locations 1361, 1362, and 1363 is removed, portions 935A and 935A" (at locations 1371 and 1372, respectively) will be a remaining part of portion 935A'; portions 1220 and 1220E (at locations 1371 and 1372, respectively) will be a remaining part of material 1220'; portions 935B and 935B" (at locations 1371 and 1372, respectively) will be a remaining part of portion 935B'; portions 1221 and 1221E (at locations 1371 and 1372, respectively) will be a remaining part of material 1221'; and portions 935C and 935C" (at locations 1371 and 1372, respectively) will be a remaining part of portion 935C'. Another view of memory device 900 along line 14-14 is shown in FIG. 14.

Figure 14:
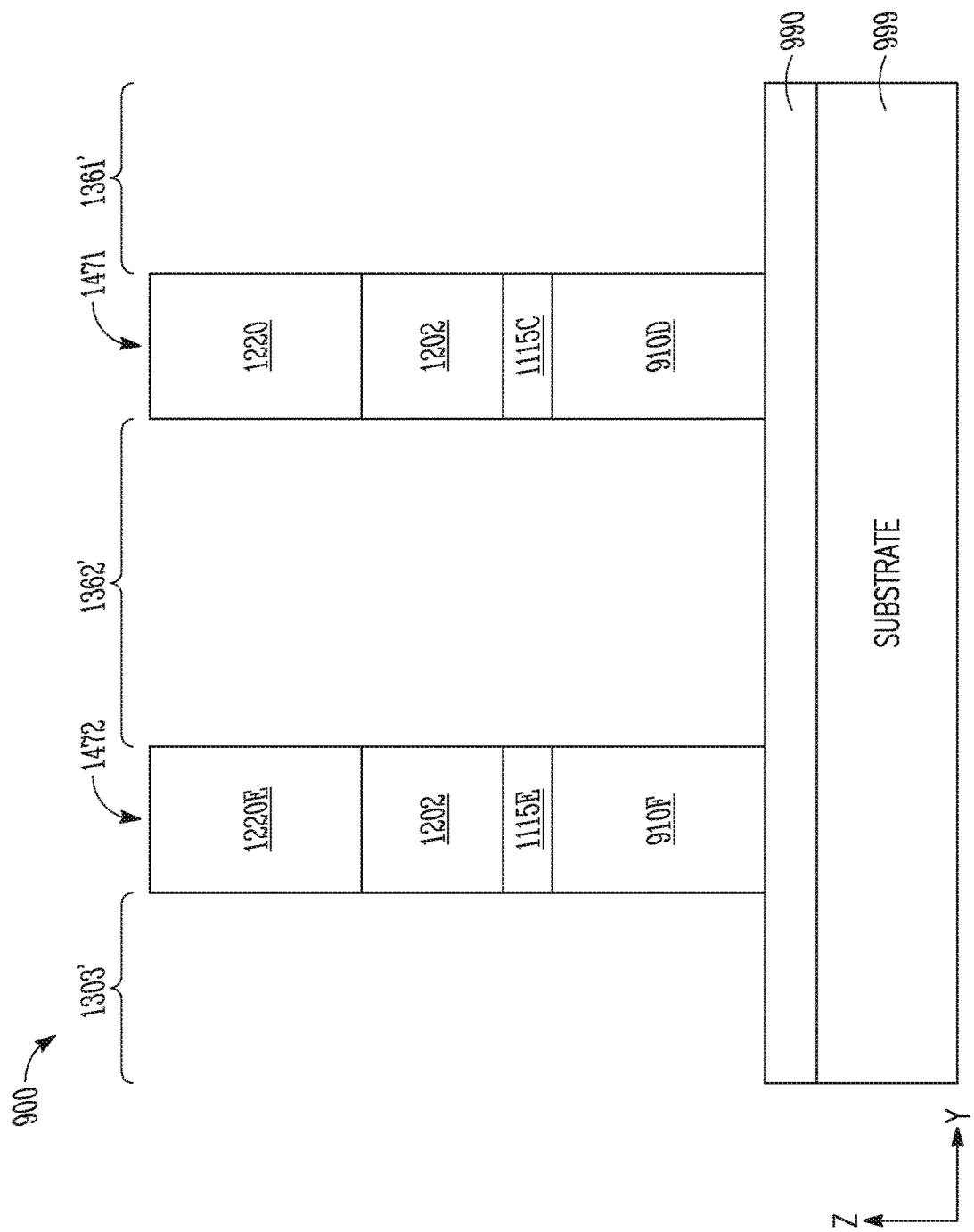

FIG. 14 shows a side view along line 14-14 of FIG. 13 with respect to the Y-Z directions after openings (e.g., trenches) 1361', 1362', and 1363' are formed at locations 1361, 1362, and 1363 (FIG. 13), respectively. Openings 1361', 1362', and 1363' can be formed by removing part of each of the materials at locations 1361, 1362, and 1363 (as mentioned above). In FIG. 14, portions 910D and 910F in the Y-direction are a remaining part of portion 910D' (FIG. 10), and portions 1115C and 1115E in the Y-direction are a remaining part of portion 1115C' (FIG. 12). Portions 1202 in the Y-direction are a remaining part of material 1202' (FIG. 12), and portions 1220 and 1220E in the Y-direction are a remaining part of material 1220' (as mentioned above in the description of FIG. 13). As shown in FIG. 14, the materials of memory device 900 include structures (e.g., protrusions (e.g., islands)) 1471 and 1472 extending outward from substrate 999. Each of structures 1471 and 1472 can form part of a memory cell in subsequent processes of forming memory device 900.

Figure 15:
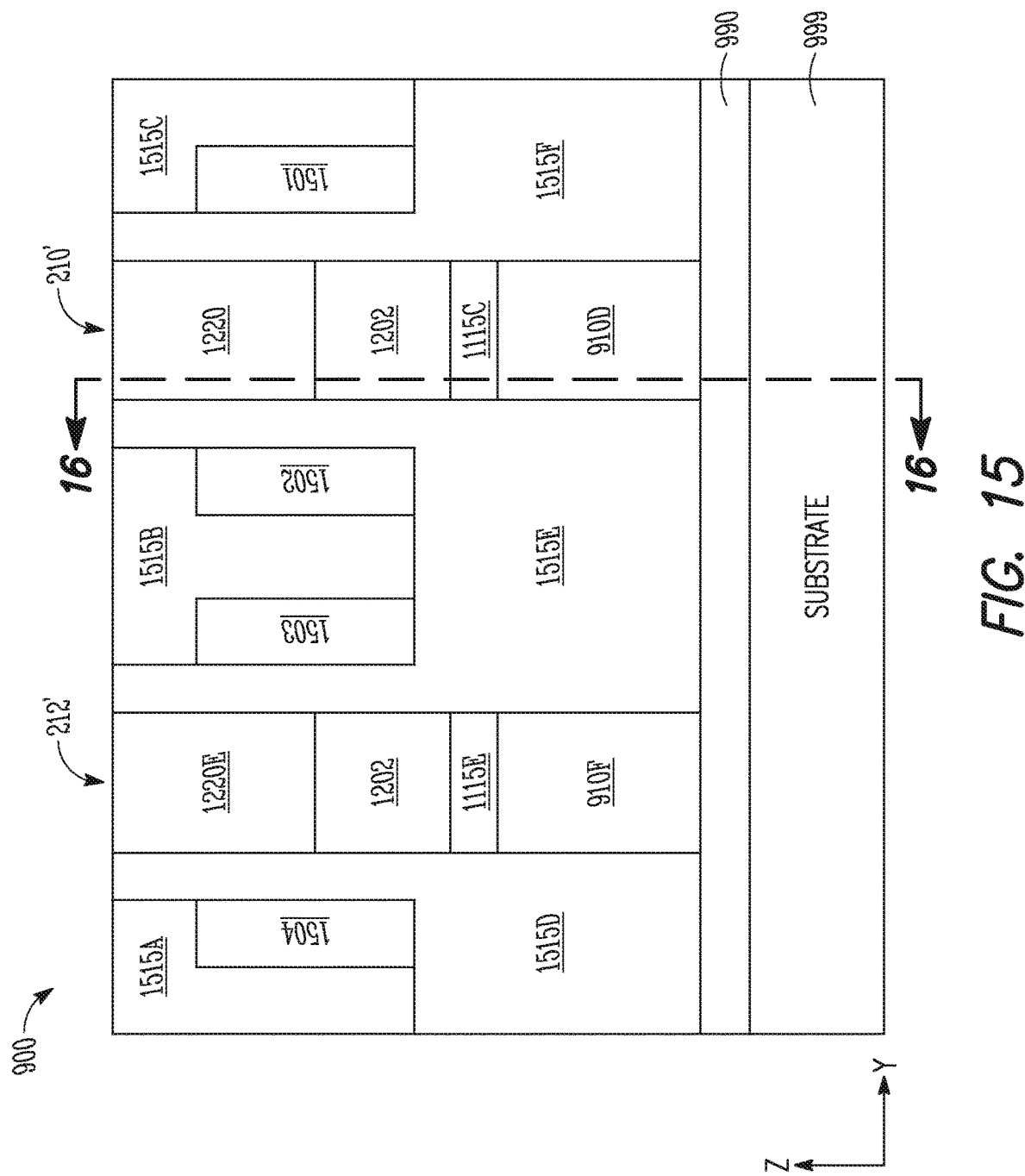

FIG. 15 shows memory device 900 of FIG. 14 after conductive lines (e.g., conductive regions) 1501, 1502, 1503, and 1504 (1501-1504), and dielectric materials 1515A, 1515B, 1515C, 1515D, 1515E, and 1515F (1515A-1515F) are formed in respective openings 1363', 1362', and 1361' (FIG. 14). Each of dielectric materials 1515A-1515F can include silicon dioxide or other dielectric materials. Each of conductive lines 1501-1504 can include metal, conductively doped polysilicon, or other conductive materials. Part of dielectric materials 1515A-1515F (e.g., part of dielectric materials 1515D, 1515E, and 1515F) can form a gate oxide structure to electrically separate conductive lines 1501, 1502, 1503, and 1504 from portions 1202, 1220, 1220E, 910D, and 910F.

Conductive lines 1501-1504 can form part of access lines (e.g., word lines) to access memory cells 210' and 212' of memory device 900. Memory cells 210' and 212' can be memory cells 210 and 212, respectively, of memory device 200 of FIG. 2.

In FIG. 15, conductive lines 1501 and 1502 can form part of an access line (e.g., word line) to access memory cell 210' and other memory cells (e.g., not shown in FIG. 15) of memory device 900. Such other memory cells can be located in the same row with memory cell 210' in the X-direction.

In FIG. 15, conductive lines 1503 and 1504 can form part of an access line (e.g., word line) to access memory cell 212' and other memory cells (not shown) of memory device 900. Such other memory cells can be located in the same row with memory cell 212' in the X-direction.

Thus, as shown in FIG. 15, conductive line 1501 can have a portion adjacent a side (e.g., right side in the Y-direction) of the channel region (e.g., portion 1202) of memory cell 210'. Conductive line 1502 can have a portion adjacent another side (e.g., left side (opposite from the right side) in the Y-direction) of the channel region (e.g., portion 1202) of memory cell 210'.

Similarly, conductive lines 1503 and 1504 can have respective portions (e.g., respective conductive regions) adjacent respective sides (opposite sides) in the Y-direction of a channel region (e.g., read channel region) of memory cell 212'. Another view of memory device 900 along line 16-16 is shown in FIG. 16.

Figure 16:
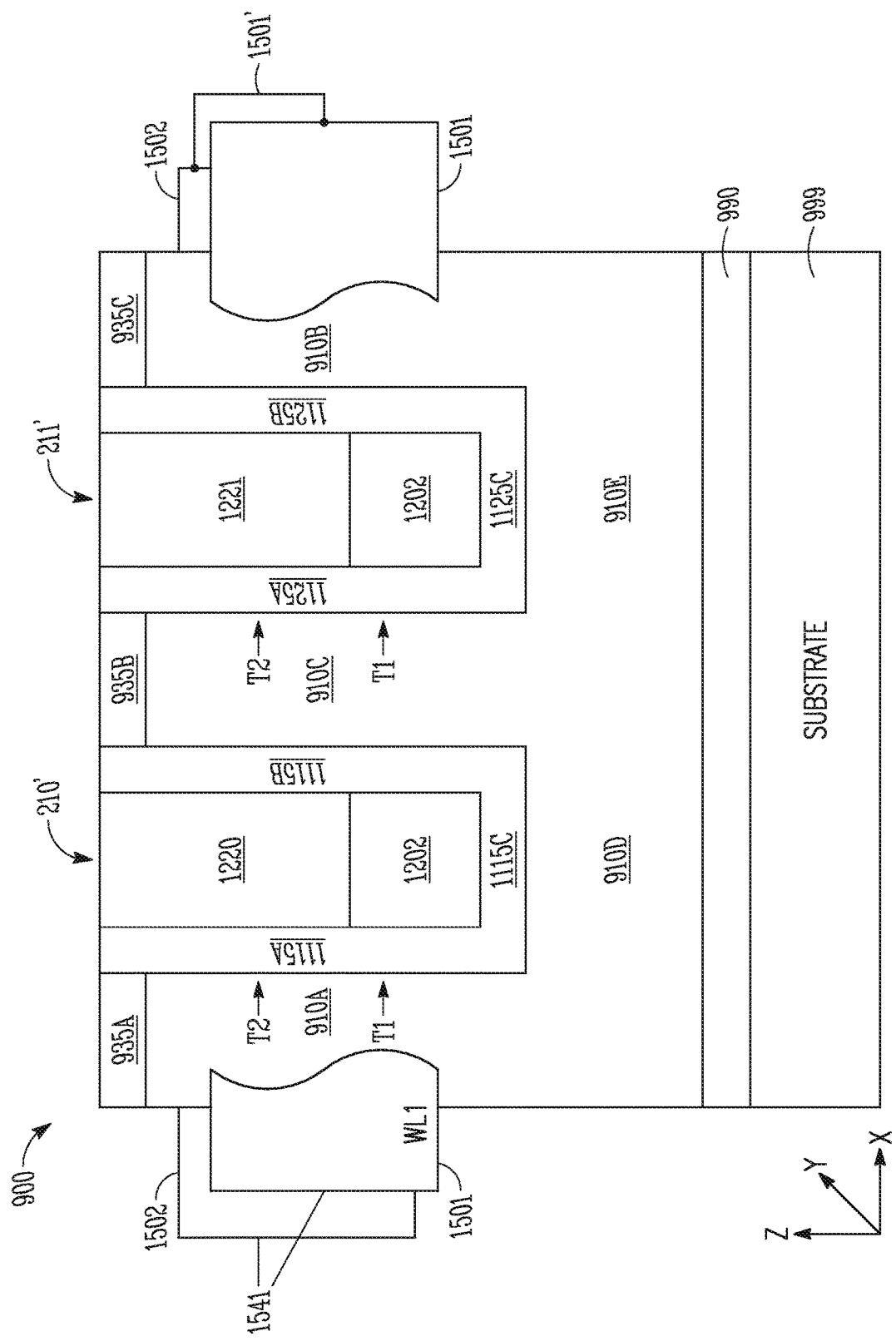

FIG. 16 shows a side view along line 16-16 of FIG. 15 with respect to the X-Z directions. In FIG. 16, conductive lines 1501 and 1502 are partially shown to avoid obstructing some parts of the other elements of memory device 900. As shown in FIG. 16, each of conductive lines 1501 and 1502 can have a length in the X-direction, a width in the Z-direction, and a thickness (e.g., less than the width) in the Y-direction (shown in FIG. 15).

In FIG. 16, portions (dielectric portions) 1115A, 1115B, and 1115C are the remaining part of portions 1115A'. 1115B', and 1115C', respectively, of FIG. 12 after part of each of portions 1115A', 1115B', and 1115C' is removed (e.g., cut) in the processes of FIG. 14 (and before conductive lines 1501-1504 are formed in the processes of FIG. 15).

In FIG. 16, portions (dielectric portions) 1125A, 1125B, and 1125C are the remaining part of portions 1125A', 1125B', and 1125C', respectively, of FIG. 12 after part of each of portions 1125A', 1125B', and 1125C' is removed (e.g., cut) in the processes of FIG. 14 (and before conductive lines 1501-1504 are formed in the processes of FIG. 15).

In FIG. 16, portions (dielectric portions) 935A, 935B, and 935C are the remaining part of portions 935A', 935B', and 935C', respectively, of FIG. 12 after part of each of portions 935A', 935B', and 935C' is removed (e.g., cut) in the processes of FIG. 14 (and before conductive lines 1501-1504 are formed in the processes of FIG. 15).

In FIG. 16, portions 910A, 910B, 910C, 910D, and 910E are the remaining part of portions 910A', 910B', 910C', 910D', and 910E', respectively, of FIG. 12 after part of each of portions 910A', 910B'. 910C', 910D', and 910E' is removed (e.g., cut) in the processes of FIG. 14 (and before conductive lines 1501-1504 are formed in the processes of FIG. 15). Each of portions 910A, 910B, 910C, 910D, and 910E can include a structure (e.g., a piece) of semiconductor material 910, which is formed in the process in FIG. 9.

Portions 910A, 910D, and 910C can form a channel region (e.g., read channel region) of a transistor T1 of memory cell 210'. Transistor T1 of memory cell 210' can be transistor T1 of memory cell 210 of memory device 200 of FIG. 2 and FIG. 5.

Portions 910B, 910E, and 910C can form a channel region (e.g., read channel region) of a transistor T1 of memory cell 211'. Transistor T1 of memory cell 211' can be transistor T1 of memory cell 211 of memory device 200 of FIG. 2 and FIG. 5.

In FIG. 16, portions 1202 are a remaining part of material 1202' of FIG. 13 (hidden under respective portions 1220 and 1221 in FIG. 13) after part of material 1202' is removed (e.g., cut) in the processes of FIG. 14 (and before conductive lines 1501-1504 are formed in the processes of FIG. 15). Each of portions 1202 can form a charge storage structure (e.g., memory element) of transistor T1 of a respective memory cell 210' or 211'.

As shown in FIG. 16, portion (e.g., charge storage structure) 1202 of transistor T1 of each of memory cells 210' and 211' can be closer (e.g., can extend in the Z-direction closer) to substrate 999 than each of conductive lines 1501 and 1502. For example, as shown in FIG. 16, a distance in the Z-direction between substrate 999 and an edge (e.g., bottom edge with respect to the Z-direction) of the material that forms portion (e.g., charge storage structure) 1202 of transistor T1 of each of memory cells 210' and 211' is less than (e.g., shorter than) a distance in the Z-direction between substrate 999 and an edge (e.g., bottom edge with respect to the Z-direction) of the material that forms each of conductive lines 1501 and 1502.

In FIG. 16, conductive lines 1501 and 1502 can be part of an access line (e.g., shared word line) 1541 which can receive a signal (e.g., word line signal) WL1 to access memory cells 210' and 211' of memory device 900 during an operation of memory device 900. For example, a signal (e.g., WL1) on conductive lines 1501 and 1502 can be used to control (e.g., turn on or turn off) transistors T1 and T2 of memory cell 210' and transistors T1 and T2 of memory cell 211'.

As shown in FIG. 16, part of conductive line 1501 can span across (e.g., overlap in the X-direction) part of portions 910A and 910C and part of portion 1220 of memory cell 210'. As described above, portions 910A and 910C can form part of a read channel region of transistor T1 of memory cell 210', and portion 1220 can form part of a write channel region of transistor T2 of memory cell 210'. Thus, as shown in FIG. 16, part of conductive line 1501 can span across (e.g., overlap) part of (e.g., on a side (e.g., front side) in the Y-direction) both read and write channel regions of transistors T1 and T2, respectively, of memory cell 210'. Although hidden from the view shown in FIG. 16, part of conductive line 1502 can span across (e.g., overlap in the X-direction) part of (e.g., on another side (e.g., back side opposite from the front side) in the Y-direction) portions 910A and 910C and a part of portion 1220 (e.g., read and write channel regions of transistors T1 and T2, respectively) of memory cell 210'.

Similarly, for memory cell 211', part of conductive line 1501 can span across (e.g., overlap in the X-direction) part of portions 910B and 910C and part of portion 1221 of memory cell 211'. As described above, portions 910B and 910C can form part of a read channel region of transistor T1 of memory cell 211', and portion 1221 can form part of a write channel region of transistor T2 of memory cell 211'. Thus, as shown in FIG. 16, part of conductive line 1501 can span across (e.g., overlap) part of (e.g., on a side (e.g., front side) in the Y-direction) both read and write channel regions of transistors T1 and T2, respectively, of memory cell 211'. Although hidden from the view shown in FIG. 16, part of conductive line 1502 can span across (e.g., overlap in the X-direction) part of (e.g., on another side (e.g., back side opposite from the front side) in the Y-direction) portions 910B and 910C and a part of portion 1221 (e.g., read and write channel regions of transistors T1 and T2, respectively) of memory cell 211'.

Since conductive lines 1501 and 1502 can span across respective portions of transistors T1 and T2 of memory cells 210' and 211', conductive lines 1501 and 1502 can have portions adjacent respective portions of transistors T1 and T2 of memory cells 210' and 211'. As shown in FIG. 16, conductive line 1501 can have a portion adjacent a side (e.g., front side in the Y-direction) of the channel region (e.g., portions 910A and 910C) of transistor T1 of memory cell 210', and adjacent a side (e.g., front side in the Y-direction) of the channel region (e.g., portion 1220) of transistor T2 of memory cell 210'. Conductive line 1502 can have a portion adjacent another side (e.g., back side (opposite from the front side) in the Y-direction) of the channel region (e.g., portions 910A and 910C) of transistor T1 of memory cell 210', and adjacent another side (e.g., back side (opposite from the front side) in the Y-direction) of the channel region (e.g., portion 1220) of transistor T2 of memory cell 210'.

Similarly, for memory cell 211', conductive line 1501 can have a portion adjacent a side (e.g., front side in the Y-direction) of a channel region (e.g., portions 910B and 910C) of transistor T1 of memory cell 211', and adjacent a side (e.g., front side in the Y-direction) of a channel region (e.g., portion 1221) of transistor T2 of memory cell 211'. Conductive line 1502 can have a portion adjacent another side (e.g., back side (opposite from the front side) in the Y-direction) of the channel region (e.g., portions 910B and 910C) of transistor T1 of memory cell 211', and adjacent another side (e.g., back side (opposite from the front side) in the Y-direction) of the channel region (e.g., portion 1221) of transistor T2 of memory cell 211'.

The processes of forming memory device 900 in FIG. 16 can include forming a conductive connection 1501' (which can include a conductive material (e.g., metal)) to electrically couple conductive lines 1501 and 1502 to each other. Similarly, the processes of forming memory device 900 can include forming a conductive connection (not shown) to electrically couple conductive lines 1503 and 1504 (FIG. 15) to each other.

Figure 17:
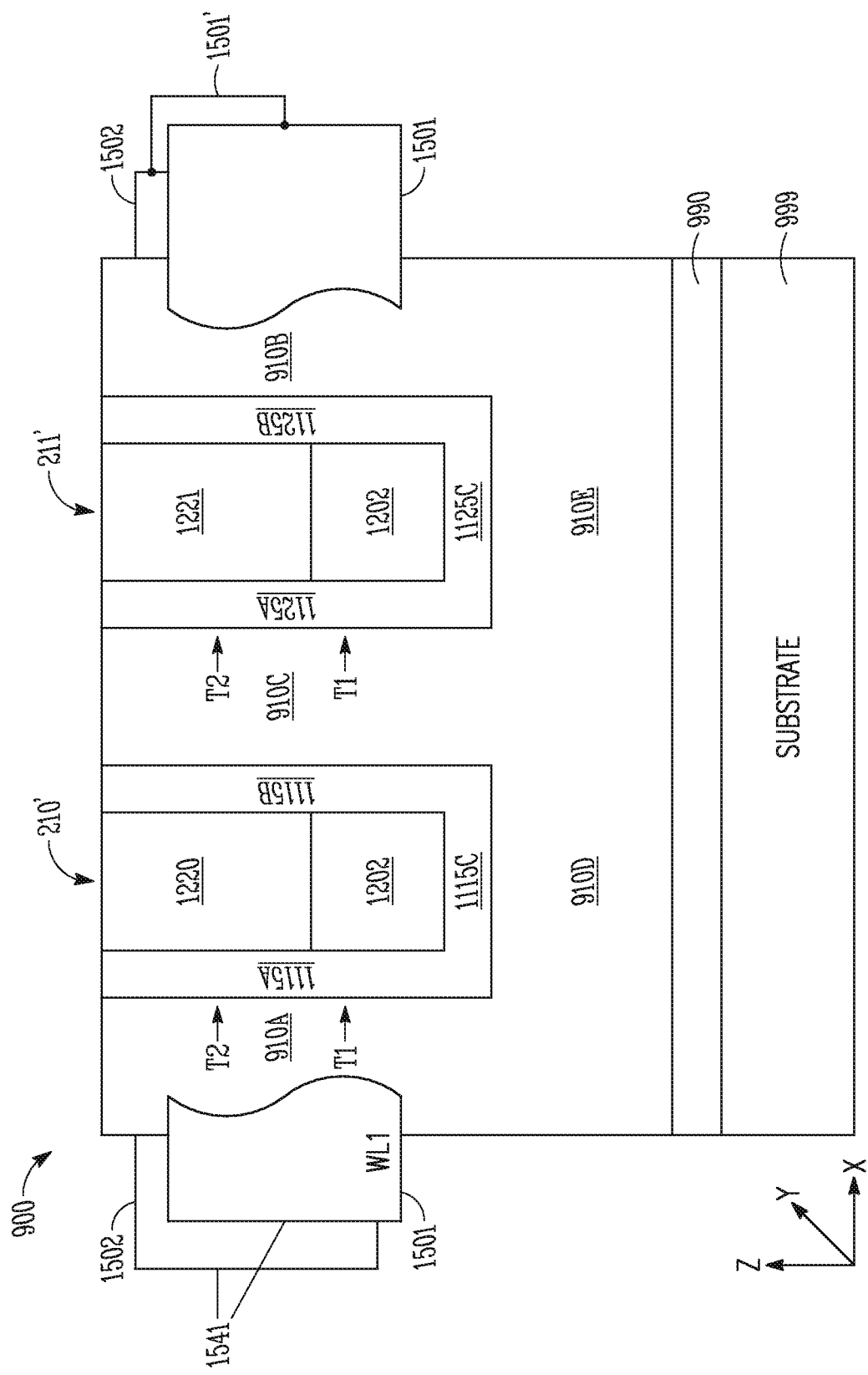

FIG. 17 shows memory device 900 after portions 935A, 935B, and 935C (FIG. 16) are removed, and part of portions 1115A, 1115B, 1125A, 1125B, 1220, and 1221 are removed. The processes in FIG. 17 can include a flattening process (e.g., CMP process) to remove portions 935A. 935B, and 935C, and part of portions 1115A, 1115B, 1125A, 1125B, 1220, and 1221.

Figure 18:
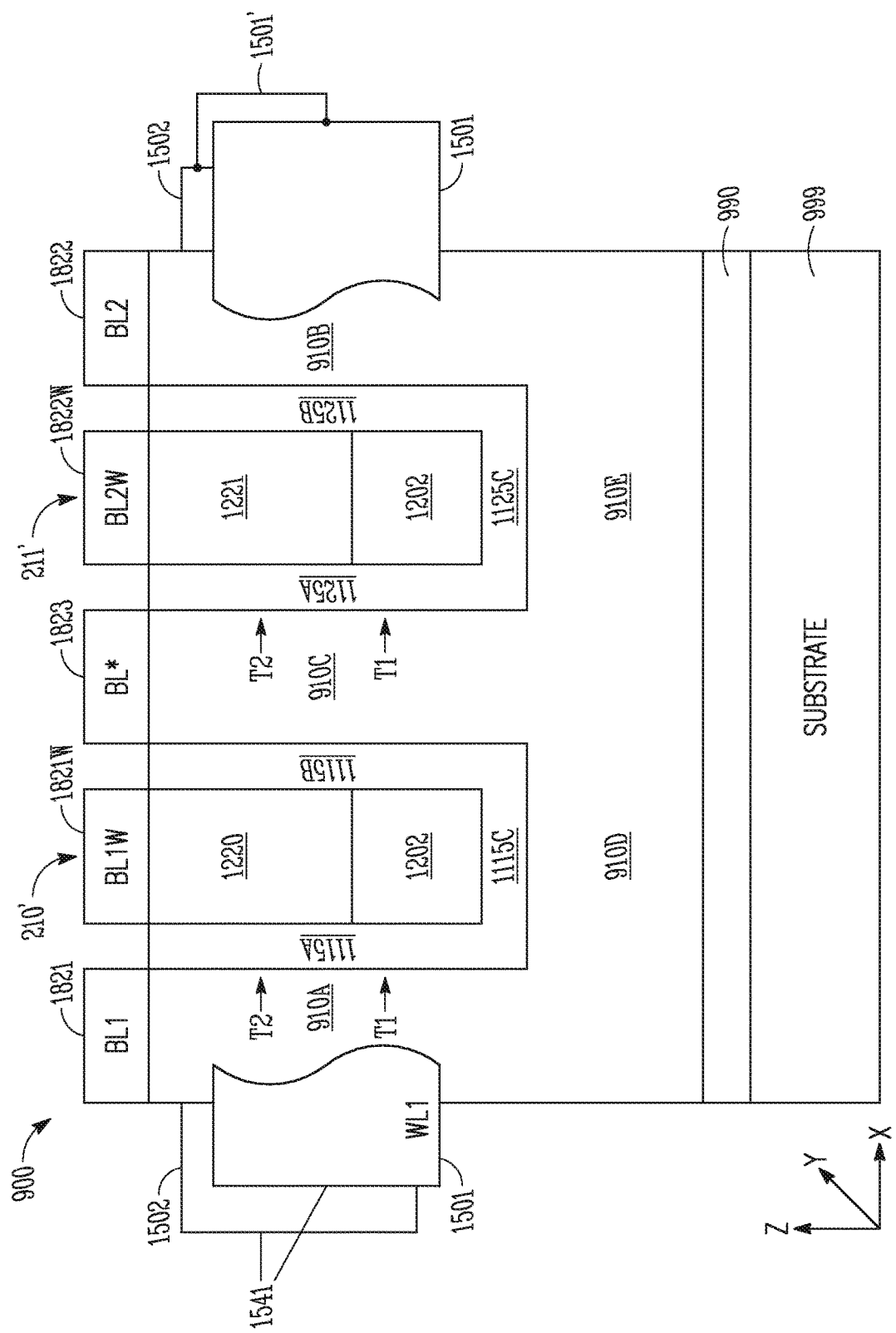

FIG. 18 shows memory device 900 after data lines (e.g., read bit lines) 1821, 1822, and 1823 and data lines (e.g., write bit lines) 1821W and 1822W are formed. Each of data lines 1821, 1822, 1823, 1821W, and 1822W can have a length in the Y-direction. The processes in FIG. 18 can include depositing a conductive material (e.g., metal) over portions 910A, 910B, 910C, 1115A, 1115B, 1125A, 1125B. 1220, and 1221. Then, part of the conductive material can be removed (e.g., patterned) to form data lines 1821, 1822, 1823, 1821W, and 1822W that are electrically coupled to (e.g., contacting) respective portions 910A, 910B, 910C, 1220, and 1221. In an operation of memory device 900, data lines 1821, 1822, 1823, 1821W, and 1822W can have signals BL1, BL2, BL*, BL1W, and BL2W, respectively. Data lines 1821, 1822, 1823, 1821W, and 1822W can represent data lines 221, 222, 223, 221W, and 222W, respectively, of memory device 200 of FIG. 2.

Figure 19:
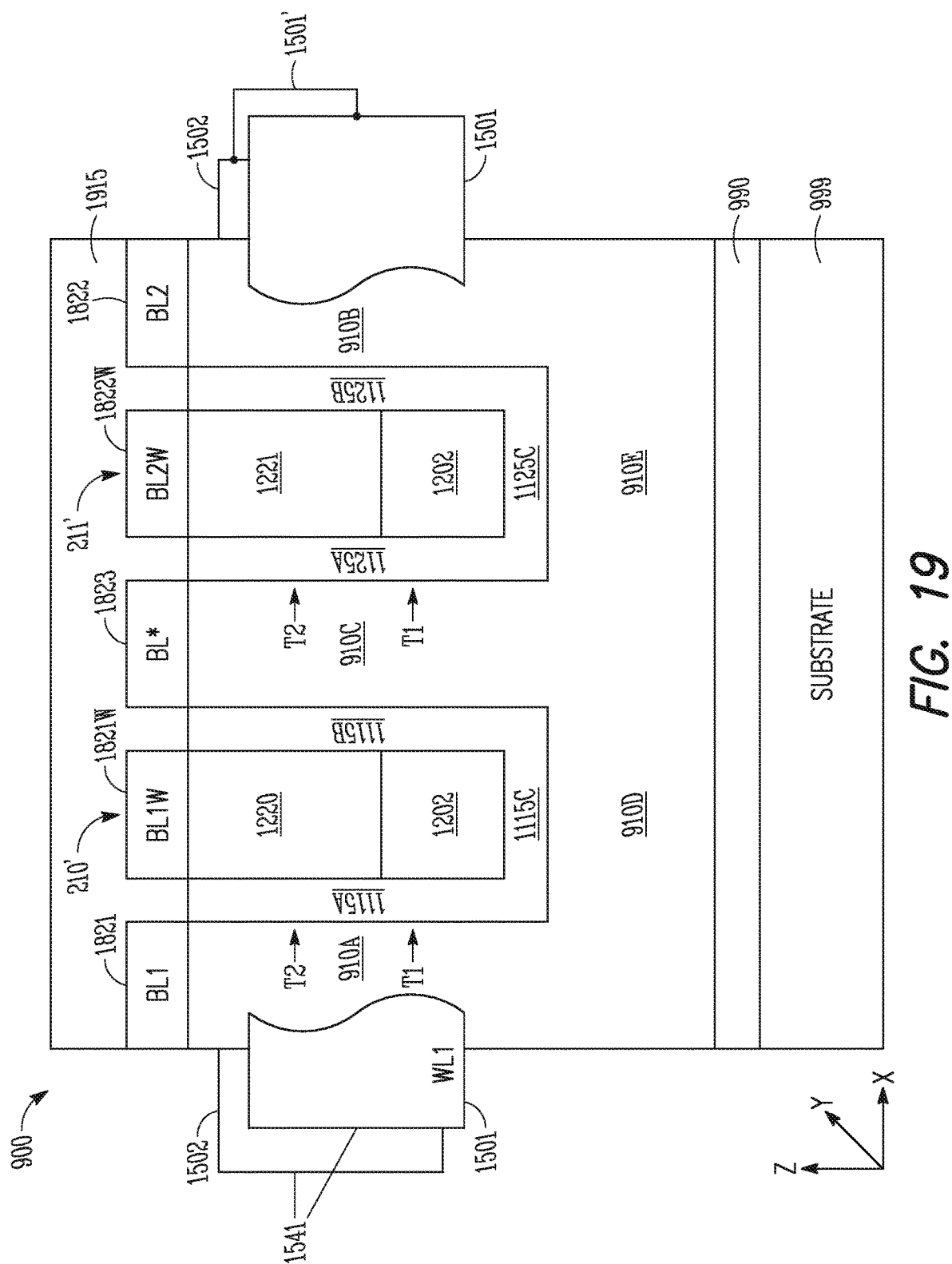

FIG. 19 shows memory device 900 after a dielectric material 1915 is formed. The processes of forming memory device 900 can include other processes that are not described in this description so as to not obscure the embodiments described herein. As shown in FIG. 19, memory device 900 can include memory cells 210' and 211' that can include transistors (e.g., transistors T1) and respective channel regions (e.g., read channel regions) formed from portions 910A, 910B, 910C, 910D, and 910E; transistors (e.g., transistors T2) and respective channel regions (e.g., write channel regions) formed from portions 1220 and 1221; and charge storage structures (e.g., memory elements) formed from portions 1202.

Memory device 900 of FIG. 19 can include data lines (e.g., read bit lines) 1821, 1822, and 1823, and data lines (e.g., write bit lines) 1821W and 1822W. Memory device 900 can include conductive lines 1501 and 1502 that can be electrically coupled to each other to form an access line (e.g., a shared access line) to control both transistors (e.g., T1 and T2) of each of memory cells 210' and 211'. Other elements of memory device 900 are described above with reference to FIG. 9 through FIG. 19.

Figure 20:
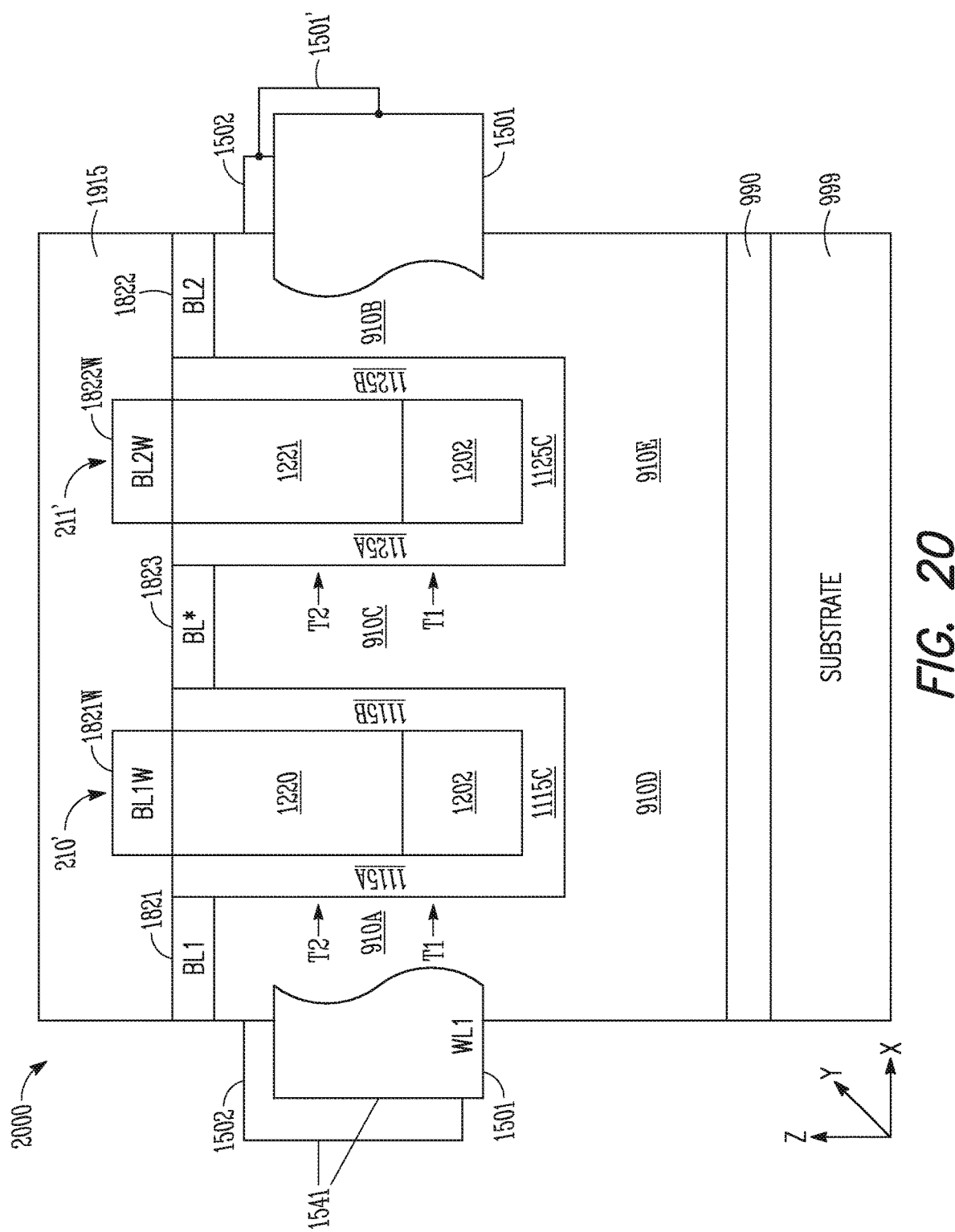
FIG. 20 shows another memory device that can be formed using a variation of the processes of forming the memory device of FIG. 9 through FIG. 19, according to some embodiments described herein.

FIG. 20 shows a memory device 2000 that can be a variation of memory device 900 of FIG. 19. Thus, the processes used to form memory device 900 can be used to form memory device 2000. Differences between memory devices 900 and 2000 include the locations of data lines (e.g., read bit lines) 1821, 1822, and 1823 relative to the locations of data lines (e.g., write bit lines) 1821W and 1822W. For example, as shown in FIG. 20, data lines 1821, 1822, and 1823 can be located on the same level of memory device 2000. However, data lines 1821, 1822, and 1823 can be located on a level that is different from the level of data lines 1821W and 1822W.

Figure 21A:
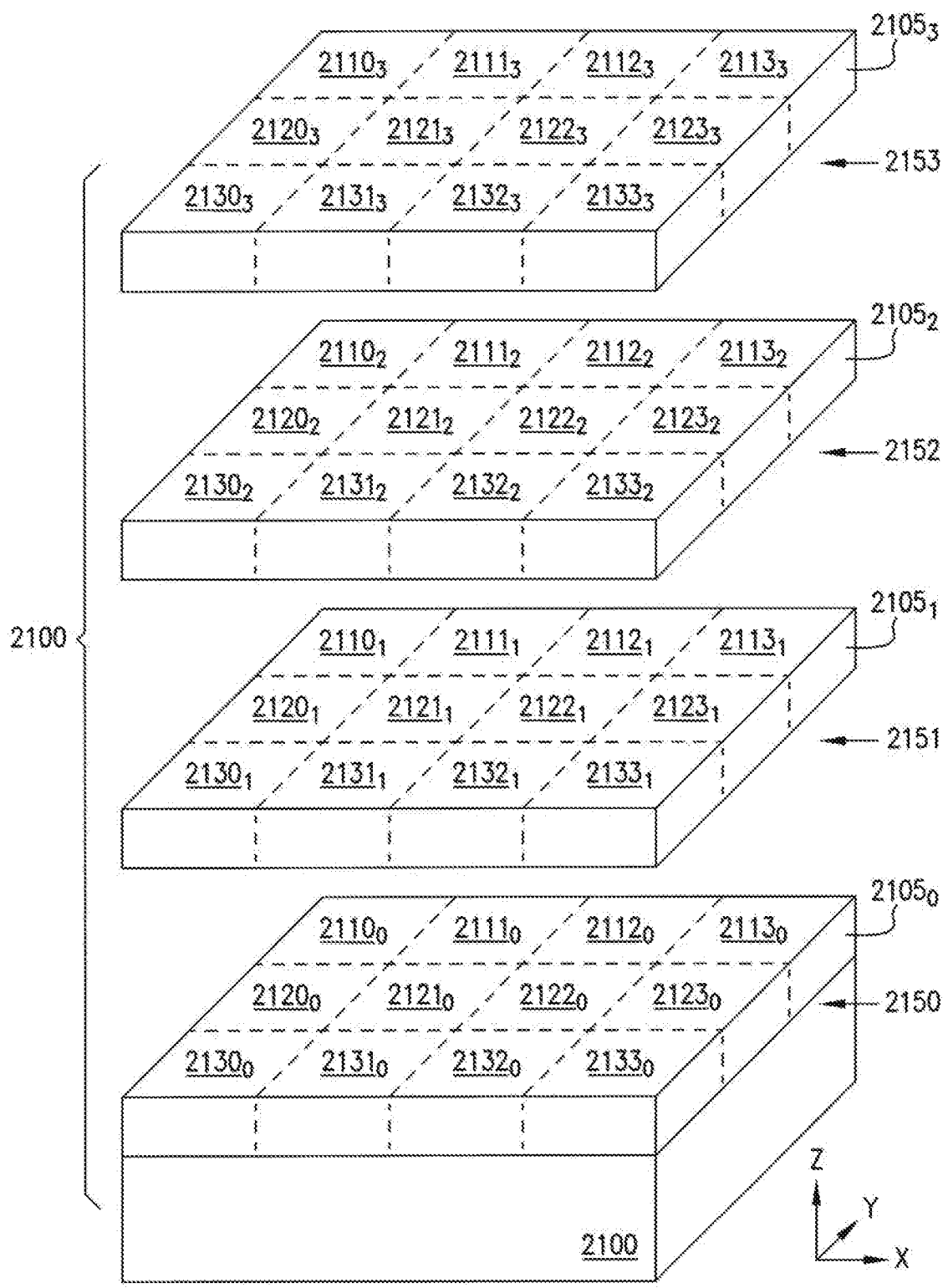
FIG. 21A, FIG. 21B, and FIG. 21C show different views of a structure of a memory device including multiple decks of memory cells, according to some embodiments described herein.
Figure 21B:
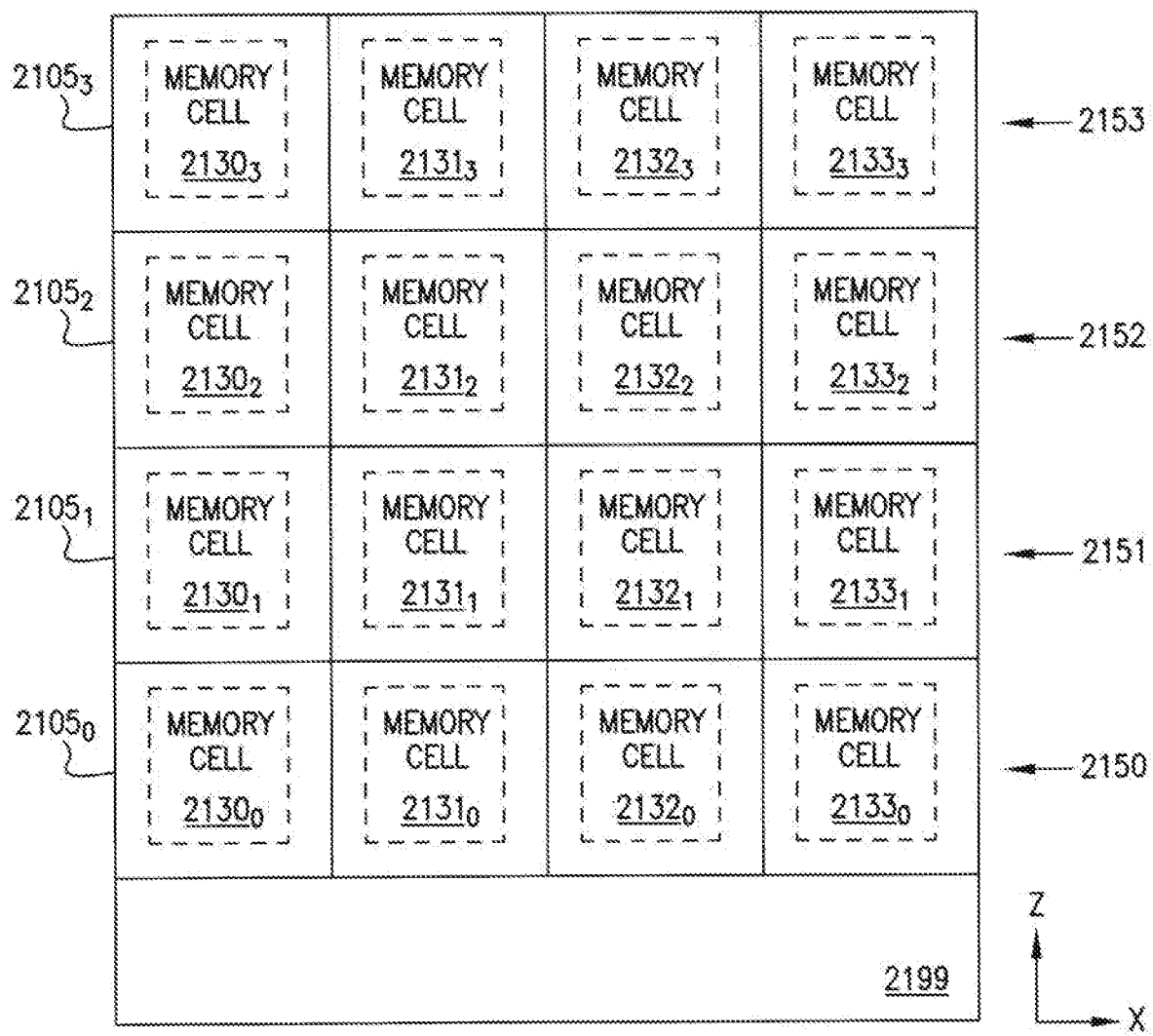
Figure 21C:
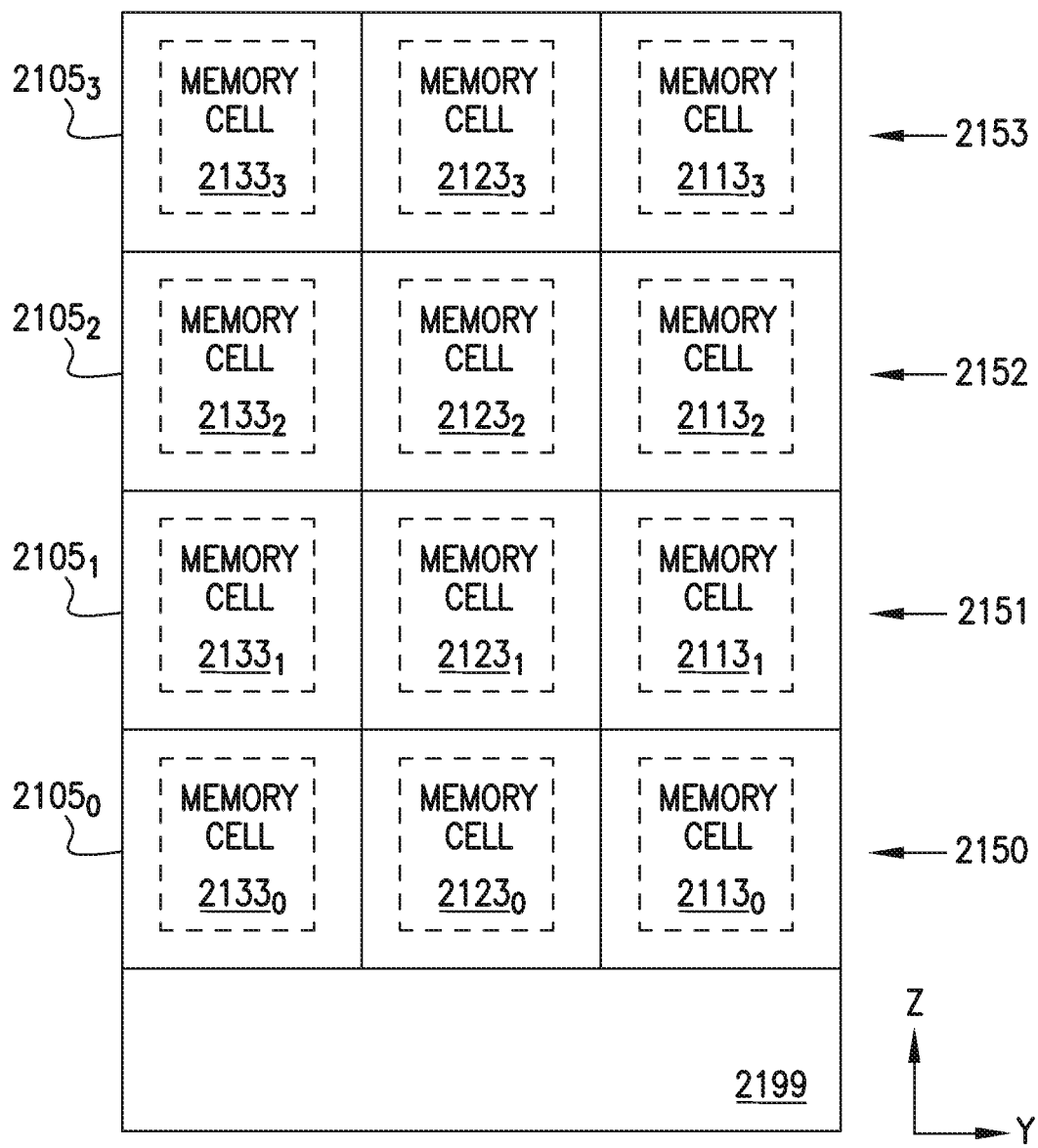

FIG. 21A, FIG. 21B, and FIG. 21C show different views of a structure of a memory device 2100 including multiple decks of memory cells, according to some embodiments described herein. FIG. 21A shows an exploded view (e.g., in the Z-direction) of memory device 2100. FIG. 21B shows a side view (e.g., cross-sectional view) in the X-direction and the Z-direction of memory device 210. FIG. 21C shows a side view (e.g., cross-sectional view) in the Y-direction and the Z-direction of memory device 2100.

As shown in FIG. 21A memory device 2100 can include decks (decks of memory cells) $2105_0$, $2105_1$, $2105_2$, and $2105_3$ that are shown separately from each other in an exploded view to help ease of viewing the deck structure of memory device 2100. In reality, decks $2105_0$, $2105_1$, $2105_2$, and $2105_3$ can be attached to each other in an arrangement where one deck can be formed (e.g., stacked) over another deck over a substrate (e.g., a semiconductor (e.g., silicon) substrate) 2199. For example, as shown in FIG. 21A, decks $2105_0$, $2105_1$, $2105_2$, and $2105_3$ can be formed in the Z-direction perpendicular to substrate 2199 (e.g., formed vertically in the Z-direction with respect to substrate 2199).

As shown in FIG. 21A, each of decks $2105_0$, $2105_1$, $2105_2$, and $2105_3$ can have memory cells arranged in the X-direction and the Y-direction (e.g., arranged in rows in the X-direction and in columns in the Y-direction). For example, deck $2105_0$ can include memory cells $2110_0$, $2111_0$, $2112_0$, and $2113_0$ (e.g., arranged in a row), memory cells $2120_0$, $2121_0$, $2122_0$, and $2123_0$ (e.g., arranged in a row), and memory cells $2130_0$, $2131_0$, $2132_0$, and $2133_0$ (e.g., arranged in a row).

Deck $2105_1$ can include memory cells $2110_1$, $2111_1$, $2112_1$, and $2113_1$ (e.g., arranged in a row), memory cells $2120_1$, $2121_1$, $2122_1$, and $2123_1$ (e.g., arranged in a row), and memory cells $2130_1$, $2131_1$, $2132_1$, and $2133_1$ (e.g., arranged in a row).

Deck $2105_2$ can include memory cells $2110_2$, $2111_2$, $2112_2$, and $2113_2$ (e.g., arranged in a row), memory cells $2120_2$, $2121_2$, $2122_2$, and $2123_2$ (e.g., arranged in a row), and memory cells $2130_2$, $2131_2$, $2132_2$, and $2133_2$ (e.g., arranged in a row).

Deck $2105_3$ can include memory cells $2110_3$, $2111_3$, $2112_3$, and $2113_3$ (e.g., arranged in a row), memory cells $2120_3$, $2121_3$, $2122_3$, and $2123_3$ (e.g., arranged in a row), and memory cells $2130_3$, $2131_3$, $2132_3$, and $2133_3$ (e.g., arranged in a row).

As shown in FIG. 21A, decks $2105_0$, $2105_1$, $2105_2$, and $2105_3$ can be located (e.g., formed vertically in the Z-direction) on levels (e.g., portions) 2150, 2151, 2152, and 2153, respectively, of memory device 2100. The arrangement of decks $2105_0$, $2105_1$, $2105_2$, and $2105_3$ forms a 3-dimensional (3-D) structure of memory cells of memory device 2100 in that different levels of the memory cells of memory device 2100 can be located (e.g., formed) in different levels (e.g., different vertical portions) 2150, 2151, 2152, and 2153 of memory device 2100.

Decks $2105_0$, $2105_1$, $2105_2$, and $2105_3$ can be formed one deck at a time. For example, decks $2105_0$, $2105_1$, $2105_2$, and $2105_3$ can be formed sequentially in the order of decks $2105_0$, $2105_1$, $2105_2$, and $2105_3$ (e.g., deck $2105_1$ is formed first and deck $2105_3$ is formed last). In this example, the memory cell of one deck (e.g., deck $2105_1$) can be formed either after formation of the memory cells of another deck (e.g., deck $2105_0$) or before formation of the memory cells of another deck (e.g., deck $2105_2$). Alternatively, decks $2105_0$, $2105_1$, $2105_2$, and $2105_3$ can be formed concurrently (e.g., simultaneously), such that the memory cells of decks $2105_0$, $2105_1$, $2105_2$, and $2105_3$ can be concurrently formed. For example, the memory cells in levels 2150, 2151, 2152, and 2153 of memory device 2100 can be concurrently formed.

The structures of the memory cells of each of decks $2105_0$, $2105_1$, $2105_2$, and $2105_3$ can include the structures of the memory cells described above with reference to FIG. 1 through FIG. 20. For example, the structures of the of the memory cells of decks $2105_0$, $2105_1$, $2105_2$, and $2105_3$ can include the structure of the memory cells of memory devices 200, 900, and 2000.

Memory device 2100 can include data lines (e.g., bit lines) and access lines (e.g., word lines) to access the memory cells of decks $2105_0$, $2105_1$, $2105_2$, and $2105_3$. For simplicity, data lines and access lines of memory cells are omitted from FIG. 21A. However, the data lines and access lines of memory device 2100 can be similar to the data lines and access lines, respectively, of the memory devices described above with reference to FIG. 1 through FIG. 20.

FIG. 21A shows memory device 2100 including four decks (e.g., $2105_0$, $2105_1$, $2105_2$, and $2105_3$) as an example. However, the number of decks can be different from four. FIG. 21A shows each of decks $2105_0$, $2105_1$, $2105_2$, and $2105_3$ including one level (e.g., layer) of memory cells as an example. However, at least one of the decks (e.g., one or more of decks $2105_0$, $2105_1$, $2105_2$, and $2105_3$) can have two (or more) levels of memory cells. FIG. 21A shows an example where each of decks $2105_0$, $2105_1$, $2105_2$, and $2105_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 100, 200, 900, 2000, and 2100) and methods (e.g., operations of memory devices 100 and 200, and methods of forming memory devices 900 and 2000) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 900, 2000, and 2100) or a system (e.g., an electronic item that can include any of memory devices 100, 200, 900, 2000, and 2100).

Any of the components described above with reference to FIG. 1 through FIG. 20 can be implemented in a number of ways, including simulation via software. Thus, apparatuses (e.g., memory devices 100, 200, 900, 2000, and 2100) or parts of each of these memory devices described above may all be characterized as "modules" (or a "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 900, 2000, and 2100) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitors, blood pressure monitors, etc.), set-top boxes, and others.

The embodiments described above with reference to FIG. 1 through FIG. 20 include apparatuses and methods of forming the apparatuses. One of the apparatuses includes a memory cell and first, second, and third data lines located over a substrate. The memory cell includes a first transistor and a second transistor. The first transistor includes a charge storage structure located on a first level of the apparatus, and a first channel region electrically separated from the charge storage structure. The second transistor includes a second channel region located on a second level of the apparatus and electrically coupled to the charge storage structure. The first and second data lines are located on a third level of the apparatus and electrically coupled to the first channel region. The first level is between the substrate and the third level. The third data line is electrically coupled to the second channel region and electrically separated from the first channel region. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A. B, and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical electrical process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a memory cell located over a substrate, the memory cell including:
a first transistor including a charge storage structure located on a first level of the apparatus, and a first channel region electrically separated from the charge storage structure; and
a second transistor including a second channel region located on a second level of the apparatus and electrically coupled to the charge storage structure;
a first data line electrically coupled to the first channel region;
a second data line electrically coupled to the first channel region, the first and second data lines located on a third level of the apparatus, the second level being between the first and third levels; and
a third data line electrically coupled to the second channel region and electrically separated from the first channel region.

2. The apparatus of claim 1 further comprising an access line, the access line including a portion spanning across part of the first channel region and part of the second channel region, wherein the access line includes a word line separated from the first, second, and third data lines, and wherein the first, second, and third data lines include bit lines.

3. The apparatus of claim 1, wherein the first channel region includes:
a first portion located on a first side of the charge storage structure;
a second portion located on a second side of the charge storage structure; and
a third portion located between the charge storage structure and the substrate.

4. The apparatus of claim 1, wherein the first and second channel regions include different materials.

5. The apparatus of claim 1, wherein the charge storage structure includes a semiconductor material.

6. The apparatus of claim 1, wherein the charge storage structure includes metal.

7. The apparatus of claim 1, wherein the second region includes at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

8. An apparatus comprising:
a first memory cell located over a substrate, the first memory cell including:
a rust transistor including a first charge storage structure and a first region electrically separated from the first charge storage structure; and
a second transistor including a second region electrically coupled to the first charge storage structure; and
a second memory cell located over the substrate, the second memory cell including:
a third transistor including a second charge storage structure and a third region electrically separated from the second charge storage structure; and
a fourth transistor including a fourth region electrically coupled to the second charge storage structure;
a first data line electrically coupled to the first region;
a second data line electrically coupled to the third region;
a third data line electrically coupled to the first and third regions; and
an access line spanning across a portion of each of the first, second, third, and fourth regions.

9. The apparatus of claim 8, wherein each of the first, second, and third data lines has a length in a first direction, and the access line has a length in a second direction.

10. The apparatus of claim 8, wherein a distance between each of the first and second charge storage structures and the substrate is less than a distance between the access line and the substrate.

11. The apparatus of claim 8, wherein each of the first and third regions includes a piece of semiconductor material, and each of the second and fourth regions includes a piece of oxide material.

12. The apparatus of claim 8, wherein the first, second, and third data lines are located on a same level of the apparatus.

13. The apparatus of claim 8, wherein:
the first region is to conduct current between the first and third data lines during an operation performed on the first memory cell; and
the third region is to conduct current between the second and third data lines during an operation performed on the second memory cell.

14. The apparatus of claim 8, wherein:
the second region is to conduct current between the second region and the first charge storage structure during an operation performed on the first memory cell; and
the fourth region is to conduct current between the fourth region and the second charge storage structure during an operation performed on the second memory cell.

15. The apparatus of claim 8, wherein:

the first and second transistors have different threshold voltages; and the third and fourth transistors have different threshold voltages.

\* \* \* \* \*